(12) United States Patent
Shimoda et al.

(10) Patent No.: US 7,279,914 B2
(45) Date of Patent: Oct. 9, 2007

(54) CIRCUIT BOARD CHECKER AND CIRCUIT BOARD CHECKING METHOD

(75) Inventors: Sugiro Shimoda, Saitama (JP); Kiyoshi Kimura, Saitama (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/542,366

(22) PCT Filed: Jan. 15, 2004

(86) PCT No.: PCT/JP2004/000242

§ 371 (c)(1),
(2), (4) Date: Jul. 14, 2005

(87) PCT Pub. No.: WO2004/077904

PCT Pub. Date: Sep. 10, 2004

(65) Prior Publication Data

US 2006/0043991 A1   Mar. 2, 2006

(30) Foreign Application Priority Data

Jan. 17, 2003 (JP) .............................. 2003-010074
Jul. 30, 2003 (JP) .............................. 2003-203846

(51) Int. Cl.
G01R 31/02 (2006.01)

(52) U.S. Cl. .................................................. 324/757

(58) Field of Classification Search ................ 324/754, 324/761–762, 765, 158.1, 757, 758
See application file for complete search history.

(56) References Cited

U.S. PATENT DOCUMENTS 4,968,931 A * 11/1990 Littlebury et al. .......... 324/760

(Continued)

FOREIGN PATENT DOCUMENTS

JP    59-214235    12/1984

(Continued)

OTHER PUBLICATIONS

U.S. Appl. No. 10/542,366, filed Jul. 14, 2005, Shimoda et al.

(Continued)

Primary Examiner—Ha Tran Nguyen
Assistant Examiner—Tung X. Nguyen
(74) Attorney, Agent, or Firm—Oblon, Spivak, McClelland, Maier & Neustadt, P.C.

(57) ABSTRACT

The present invention provides an inspection apparatus for circuit board for conducting electrical inspection by electrically connecting inspection object electrodes of the circuit board to a plurality of inspection electrodes formed in accordance with a pattern corresponding to the inspection object electrodes through an anisotropically conductive sheet, wherein each of an upper-side board-compressing member and a lower-side board-compressing member respectively arranged on an upper side and lower side of the inspection object circuit board is provided on upper-side base plate and lower-side base plate supported by a plurality of supports of support-infixing plates, and an upper-side supporting point and a lower-side supporting point corresponds to the respective supports on the respective base plates are arranged at positions different from each other on a plane of projection in a thickness-wise direction of the upper-side board-compressing member and lower-side board-compressing member when the inspection apparatus is seen through from above, whereby being capable of conducting the inspection high in reliability even to the circuit board small in such as size of the inspection object electrodes, and an inspection process for circuit board.

9 Claims, 13 Drawing Sheets

U.S. PATENT DOCUMENTS 5,477,160 A * 12/1995 Love .................... 324/755
6,297,652 B1 * 10/2001 Shimoda et al. .......... 324/754

FOREIGN PATENT DOCUMENTS

| JP | 5-341007 | 12/1993 |
| JP | 7-105741 | 4/1995 |
| JP | 2000-74965 | 3/2000 |
| JP | 2001-148260 | 5/2001 |

OTHER PUBLICATIONS

U.S. Appl. No. 11/632,287, filed Jan. 12, 2007, Kimura et al.

* cited by examiner (a)

(b)

BACKGROUND ART

BACKGROUND ART

BACKGROUND ART

BACKGROUND ART

CIRCUIT BOARD CHECKER AND CIRCUIT BOARD CHECKING METHOD

RELATED APPLICATION DATA

The present application is a national stage 371 of PCT/JP 04/00242 filed on Jan. 15, 2004.

1. Technical Field

The present invention relates to an inspection apparatus for circuit board and an inspection process for circuit board.

2. Background Art

In electrical inspection of a circuit board, it is conducted to measure an electric resistance between electrodes of an inspection object circuit board (hereinafter also referred to as "circuit board to be inspected").

In the measurement of an electric resistance of a circuit board, there has heretofore been adopted, for example, a means in which probes PA and PD for current supply and probes PB and PC for voltage measurement are pressed against and brought into respective contact with 2 inspection object electrodes 81 and 82 (hereinafter also referred to as "electrodes to be inspected"), which have been electrically connected to each other in a circuit board 80 to be inspected, as illustrated in FIG. 15, a current is supplied between the proves PA and PD for current supply from a power supply device 83 in this state, and a voltage signal detected by the probes PB and PC for voltage measurement at this time is processed in an electric signal processor 84, thereby determining an electric resistance value between the electrodes 81 and 82 to be inspected.

In the method described above, however, the surfaces of the electrodes 81 and 82 to be inspected may be damaged by pressing the probes because it is necessary to bring the probes PA and PD for current supply and the probes PB and PC for voltage measurement into respective contact with the electrodes 81 and 82 to be inspected by considerably great pressing force, the probes are made of a metal, and the tips thereof are pointed, so that the circuit board becomes unusable. Under such circumstances, the electric resistance measurement cannot be carried out on all circuit boards to be provided as products, and so the method cannot help adopting the so-called sampling inspection, and after all, the yield of the products cannot be increased.

In order to solve such a problem, there have heretofore been proposed inspection apparatus in which a connecting member coming into contact with electrodes to be inspected is formed by an anisotropically conductive sheet (see, for example, Prior Art. 1 to Prior Art. 3).

According to such inspection apparatus, an electrode for current supply and an electrode for voltage measurement are brought into contact with electrodes to be inspected of a circuit board to be inspected through the anisotropically conductive sheet, whereby electrical connection is achieved, so that the measurement of electric resistance can be conducted without damaging the electrodes to be inspected.

As a certain kind of inspection apparatus which achieves electrical connection to electrodes to be inspected through an anisotropically conductive sheet, is used, for example, an apparatus of the construction that an upper-side board-compressing member 91A arranged on an upper surface side of a circuit board 1 to be inspected, on which upper-side electrodes 2 to be inspected are provided, and having an anisotropically conductive sheet 93A on its front surface (lower surface in FIG. 16), and a lower-side board-compressing member 91B arranged on a lower surface side of the circuit board 1 to be inspected, on which lower-side electrodes 3 to be inspected are provided, and having an anisotropically conductive sheet 93B on its front surface (upper surface in FIG. 16) are arranged so as to be opposed to each other in vertical direction as illustrated in FIG. 16.

In such an inspection apparatus (hereinafter also referred to as "first conventional apparatus") 90, the upper-side board-compressing member 91A and lower-side board-compressing member 91B are respectively provided on base plates 96A and 96B supported by a plurality of supports 94A and 94B respectively infixed into flat plate-like support-infixing plates 95A and 95B and vertically extending from the support-infixing plates 95A and 95B, and as illustrated in FIG. 17, supporting points 97A formed by the supports 94A on the base plate 96A and supporting points 97B formed by the supports 94B on the base plate 96B on a plane M4 of projection in a thickness-wise direction of the base plates 96A, 96B when the first conventional apparatus 90 is seen through from above are located at the same positions. In FIG. 17, the supporting points (hereinafter also referred to as "upper-side supporting points") 97A related to the upper-side board-compressing member 91A and the supporting points (hereinafter also referred to as "lower-side supporting point") 97B related to the lower-side board-compressing member 91B are indicated by a black circle and a white circle, respectively.

In FIG. 16, reference numeral 92A designates a circuit board for inspection, on which electrodes for current supply and electrodes for voltage measurement (both not illustrated) making up pairs of inspection electrodes corresponding to the upper-side electrodes 2 to be inspected have been formed, reference character 92B designates a circuit board for inspection, on which electrodes for current supply and electrodes for voltage measurement (both not illustrated) making up pairs of inspection electrodes corresponding to the lower-side electrodes 3 to be inspected have been formed, reference numerals 98A and 98B designate electrode devices electrically connected to the respective circuit boards 92A and 92B for inspection and a tester (not illustrated), and reference numerals 99A and 99B designate anisotropically conductive sheets.

In this first conventional apparatus 90, the support-infixing plates 95A and 95B related to each of the upper-side board-compressing member 91A and lower-side board-compressing member 91B are moved in directions approaching to the circuit board 1 to be inspected, thereby pressing the base plates 96A and 96B by the supports 94A and 94B to compress the circuit board 1 to be inspected by the upper-side board-compressing member 91A and lower-side board-compressing member 91B. As a result, a measurable state is brought about. In this measurable state, the anisotropically conductive sheets 93A and 93B provided on the respective surfaces of the upper-side board-compressing member 91A and lower-side board-compressing member 91B are brought into contact with pressure with the respective electrodes to be inspected of the circuit board 1 to be inspected, whereby measurement of electric resistance is carried out by applying pressure to the respective electrodes to be inspected.

With respect to a printed circuit board for generally mounting integrated circuits or the like, it is necessary to confirm that a wiring pattern of the circuit board has the expected performance before the integrated circuits or the like are mounted. Therefore, the inspection of the electrical properties thereof is conducted. As an inspection apparatus for inspecting such a circuit board, there is known that having the construction that anisotropically conductive sheet is intervened between an inspection object circuit board and a plurality of inspection electrodes arranged in accordance with a pattern corresponding to inspection object electrodes of the inspection object circuit board to conduct the electrical inspection of the inspection object circuit board (see, for example, Prior Art. 4).

As a certain kind of inspection apparatus for such a circuit board, is used, for example, an apparatus having the construction that an upper-side board-compressing member 101A having a circuit board 102 for inspection, on which inspection electrodes 102A corresponding to upper-side electrodes 2 to be inspected of an inspection object circuit board (circuit board to be inspected) 1 have been formed, and a lower-side board-compressing member 101B having a circuit board 107 for inspection, on which inspection electrodes 107A corresponding to lower-side electrodes 3 to be inspected have been formed, which are arranged on an upper side having the upper-side electrodes 2 to be inspected and on a lower side having the lower-side electrodes 3 to be inspected in the circuit board 1 to be inspected, respectively, are arranged so as to be opposed to each other in vertical direction as illustrated in FIG. 18, and the upper-side board-compressing member 101A and lower-side board-compressing member 101B are respectively provided on base plates 106 supported by a plurality of supports 104 infixed into flat plate-like support-infixing plates 105 and vertically extending from the support-infixing plates 105.

In this inspection apparatus (hereinafter also referred to as "second conventional apparatus") 100, anisotropically conductive sheets 103 are provided on the respective surfaces of the circuit boards 102 and 107 for inspection. In FIG. 18, reference numeral 108 designates electrode devices electrically connected to the respective circuit boards 102 and 107 for inspection and a circuit board for inspection of a tester (not illustrated), and reference numeral 109 designates anisotropically conductive sheet.

In this second conventional apparatus 100, the support-infixing plates 105 related to each of the upper-side board-compressing member 101A and lower-side board-compressing member 101B are moved in directions approaching to the circuit board 1 to be inspected, thereby pressing the base plates 106 by the supports 104 to compress the circuit board 1 to be inspected by the upper-side board-compressing member 101A and lower-side board-compressing member 101B. As a result, a measurable state is brought about.

In this second conventional apparatus 100, as with the first conventional apparatus 90, upper-side supporting points formed by the supports 104 on the base plate 106 related to the upper-side board-compressing member 101A and lower-side supporting points formed by the supports 104 on the base plate 106 related to the lower-side board-compressing member 101B on a plane of projection in a thickness-wise direction of the base plates when the second conventional apparatus 100 is seen through from above are located at the same positions.

In the conventional apparatus of the above-described construction, the anisotropically conductive sheet is a sheet exhibiting conductivity only in its thickness-wise direction or having pressure-sensitive conductive conductor parts exhibiting conductivity only in the thickness-wise direction when they are pressurized in the thickness-wise direction. Since the anisotropically conductive sheet has such features that compact electrical connection can be achieved without using any means such as soldering or mechanical fitting, and that soft connection is feasible with mechanical shock or strain absorbed therein, it functions as a connector for achieving electrical connection making use of such features.

On the other hand, in recent years, the size and pitch or clearance of electrodes in a circuit board have tended to become small for the purpose of achieving a high degree of integration.

In an inspection apparatus for inspecting such a circuit board, that having a small thickness is used as the anisotropically conductive sheet for the purpose of exactly electrically connecting electrodes to be inspected of the circuit board to be inspected to inspection electrodes corresponding to the electrodes to be inspected. The anisotropically conductive sheet having the small thickness involves a problem that it cannot sufficiently absorb strain due to deflection caused to the base plate by being pressed by the supports, and so, in the measurable state, a scatter of pressure distribution tends to occur on the circuit board to be inspected to encounter difficulty in applying even pressure to the respective electrodes to be inspected of the circuit board to be inspected.

In the inspection apparatus having such a thin anisotropically conductive sheet, the inspection is conducted with great pressing force for applying pressure of at least a certain value to all the electrodes to be inspected of the circuit board to be inspected to achieve expected measurable state as to the respective electrodes to be inspected of the circuit board to be inspected, and so great pressure is also applied to the anisotropically conductive sheet at every inspection. Therefore, the anisotropically conductive sheet is liable to be deteriorated. As a result, a problem that inspection efficiency is lowered as the anisotropically conductive sheet is required to be frequently replaced in the inspection apparatus also arises.

In the inspection apparatus, it is thus investigated to make the thickness of the base plate greater for lessening the deflection of the base plate caused by pressing of the supports.

However, when the thickness of the base plate making up the inspection apparatus is made great, points of application of the pressing force applied to the circuit board to be inspected by the supports through the base plates and board-compressing members are formed at the same positions on a plane of projection in a thickness-wise direction of the board-compressing members when the inspection apparatus is seen through from above. The pressing force is thus concentrated on the points of application in the circuit board to be inspected, and so the pressing force at the points of application becomes greatest, and the pressing force at positions distant from the points of application becomes smaller as the distance from the points of application is greater. A scatter of pressure distribution is thus caused. As a result, a problem that a scatter of electrically connected state related to the electrodes to be inspected of the circuit board to be inspected is caused is involved. Another problem that the weight of the apparatus itself is increased by the increase in the thickness of the base plate is also involved.

When the thickness of base plates is made great in an inspection apparatus having the construction that through-holes are formed in the base plates, a problem that the step of forming the through-holes in the base plates becomes complicated in the production process thereof to lower productivity is also involved.

More specifically, when it is intended to form a through-hole in a thick base plate by one drilling operation, for example, a drill bit is liable to be damaged or broken. Therefore, the through-hole is generally formed by means of a method in which a concave hole is formed by conducting a drilling operation from one side of the base plate, and a drilling operation is also conducted from the other side of the base plate to form a concave hole so as to be linked to the first-mentioned concave hole. Since one through-hole is formed in such a manner, it is necessary to conduct the drilling operation plural times. It thus takes a long time to conduct the drilling operations, and moreover there is a possibility that the concave holes formed by the respective drilling operations may not be linked in an expected state, so that the through-holes cannot be formed with high efficiency.

Prior Art. 1: Japanese Patent Application Laid-Open No. 26446/1997;

Prior Art. 2: Japanese Patent Application Laid-Open No. 2000-74965;

Prior Art. 3: Japanese Patent Application Laid-Open No. 2000-241485;

Prior Art. 4: Japanese Patent Application Laid-Open No. 183974/1991.

DISCLOSURE OF THE INVENTION

The present invention has been made on the basis of the foregoing circumstances and has as its first object the provision of a light-weight inspection apparatus for circuit board capable of conducting electrical inspection of a circuit board with high reliability even when the inspection object circuit board has inspection object electrodes small in size and pitch or clearance.

A second object of the present invention is to provide an inspection process for circuit board capable of conducting electrical inspection of a circuit board with high reliability even when the circuit board has inspection object electrodes small in size and pitch or clearance.

A third object of the present invention is to provide a light-weight inspection apparatus for circuit board capable of conducting electrical inspection of a circuit board with high reliability even when the circuit board has inspection object electrodes small in size and pitch or clearance, capable of easily designing miniaturization and simplification, and capable of being produced at low cost and capable of inhibit the deterioration of an anisotropically conductive sheet upon inspection.

A fourth object of the present invention is to provide a light-weight inspection apparatus for circuit board having a structure that achieves high productivity and capable of conducting electrical inspection of a circuit board with high reliability even when the circuit board has inspection object electrodes small in size and pitch or clearance.

According to the present invention, there is thus provided an inspection apparatus for circuit board for conducting electrical inspection of an inspection object circuit board by electrically connecting inspection object electrodes of the inspection object circuit board to a plurality of inspection electrodes formed in accordance with a pattern corresponding to the inspection object electrodes through an anisotropically conductive sheet, which comprises an upper-side board-compressing member arranged on an upper side of the inspection object circuit board and a lower-side board-compressing member arranged on a lower side of the inspection object circuit board, wherein either one of the upper-side board-compressing member and lower-side board-compressing member has the plurality of the inspection electrodes, the upper-side board-compressing member and lower-side board-compressing member are respectively provided on base plates supported by a plurality of supports infixed into support-infixing plates, and an upper-side supporting point corresponds to the upper-side support on the upper-side base plate related to the upper-side board-compressing member and a lower-side supporting point corresponds to the lower-side support on the lower-side base plate related to the lower-side board-compressing member are arranged at positions different from each other on a plane of projection in a thickness-wise direction of the upper-side board-compressing member and lower-side board-compressing member when the inspection apparatus is seen through from above.

In the inspection apparatus for circuit board according to the present invention, it may be preferable that the upper-side board-compressing member has an anisotropically conductive sheet on its surface, and the lower-side board-compressing member has an anisotropically conductive sheet on its surface.

In the inspection apparatus for circuit board according to the present invention, the upper-side base plate and the lower-side base plate is pressed, respectively, by the upper-side supports and the lower-side supports, thereby bringing about a measurable state that the inspection object circuit board is compressed by the upper-side board-compressing member and lower-side board-compressing member.

In the inspection apparatus for circuit board according to the present invention, in the measurable state, a complex stack composed of the inspection object circuit board and the upper-side board-compressing member and lower-side board-compressing member for compressing the inspection object circuit board is deformed by shifting in the thickness-wise direction together with the upper-side base plate and lower-side base plate, at positions, over the whole body, respectively pressed by the upper-side supports and lower-side supports in accordance with the upper-side supporting points and lower-side supporting points.

In the measurable state, a gap in the thickness-wise direction of the complex stack between a tip level in the upper-side support and a tip level in the lower-side support may be smaller than the total thickness of the complex stack, the upper-side base plate and the lower-side base plate.

In the inspection apparatus for circuit board according to the present invention, it may be preferable that the upper-side supporting points and the lower-side supporting points be formed in the form of a lattice on the upper-side base plate and on the lower-side base plate, respectively, and on the plane of projection in the thickness-wise direction of the upper-side board-compressing member and the lower-side board-compressing member, only one lower-side supporting point be arranged within an upper-side unit region partitioned by adjacent 4 upper-side supporting points, and only one upper-side supporting point be arranged within a lower-side unit region partitioned by adjacent 4 lower-side supporting points.

In the inspection apparatus for circuit board, clearances between upper-side supporting points adjacent to each other related to the upper-side unit region, and between lower-side supporting points adjacent to each other related to the lower-side unit region may preferably be each 10 to 100 mm.

In the inspection apparatus for circuit board according to the present invention, the upper-side base plate and lower-side base plate may preferably be each composed of an insulating material having a resistivity of at least $1 \times 10^{10}$ $\Omega \cdot cm$, and have a thickness of 1 to 10 mm.

In inspection apparatus for circuit board according to the present invention, the thickness of each of the upper-side base plate and lower-side base plate may preferably be at most 5 mm.

According to the present invention, there is also provided an inspection process for circuit board, which comprises using the inspection apparatus for circuit board described above, pressing the upper-side base plate and the lower-side base plate by the upper-side supports and the lower-side supports, respectively, to form a measurable state that an inspection object circuit board is compressed by the upper-side board-compressing member and lower-side board-compressing member, and in this measurable state, deforming a complex stack composed of the inspection object circuit board and the upper-side board-compressing member and lower-side board-compressing member for compressing the inspection object circuit board by shifting in the thickness-wise direction together with the upper-side base plate and lower-side base plate, at positions, over the whole body, respectively pressed by the upper-side supports and lower-side supports in accordance with the upper-side supporting points and lower-side supporting points.

According to the present invention, there is further provided an inspection apparatus for circuit board for measuring an electric resistance of an inspection object circuit board by electrically connecting a pair of inspection electrodes formed of an electrode for current supply and an electrode for voltage measurement arranged in relation separated from each other to each of a plurality of inspection object electrodes formed on the inspection object circuit board, through an anisotropically conductive sheet, which comprises an upper-side board-compressing member arranged on an upper side of the inspection object circuit board and having an anisotropically conductive sheet on its surface, and a lower-side board-compressing member arranged on a lower side of the inspection object circuit board and having an anisotropically conductive sheet on its surface, wherein the upper-side board-compressing member and lower-side board-compressing member each have plural pairs of inspection electrodes and are respectively provided on base plates supported by a plurality of supports infixed into support-infixing plates, and an upper-side supporting point corresponds to the upper-side support on the upper-side base plate related to the upper-side board-compressing member and a lower-side supporting point corresponds to the lower-side support on the lower-side base plate related to the lower-side board-compressing member are arranged at positions different from each other on a plane of projection in a thickness-wise direction of the upper-side board-compressing member and lower-side board-compressing member when the inspection apparatus is seen through from above.

In the inspection apparatus for circuit board according to the present invention, the upper-side base plate and the lower-side base plate is pressed, respectively, by the upper-side supports and the lower-side supports, thereby bringing about a measurable state that the inspection object circuit board is compressed by the upper-side board-compressing member and lower-side board-compressing member to carry out the measurement of the electric resistance.

In the inspection apparatus for circuit board according to the present invention, in the measurable state, a complex stack composed of the inspection object circuit board, and the upper-side board-compressing member and lower-side board-compressing member for compressing the inspection object circuit board is deformed by shifting in the thickness-wise direction together with the upper-side base plate and lower-side base plate, at positions, over the whole body, respectively pressed by the upper-side supports and lower-side supports in accordance with the upper-side supporting points and lower-side supporting points.

In the inspection apparatus for circuit board according to the present invention, in the measurable state, a gap in the thickness-wise direction of the complex stack between a tip level in the upper-side support and a tip level in the lower-side support may be smaller than the total thickness of the complex stack, the upper-side base plate and the lower-side base plate.

In inspection apparatus for circuit board according to the present invention, the thickness of each of the upper-side base plate and lower-side base plate may preferably be at most 5 mm.

In the inspection apparatus for circuit board according to the present invention, it may be preferable that the upper-side supporting points and the lower-side supporting points be formed in the form of a lattice on the upper-side base plate and on the lower-side base plate, respectively, and on the plane of projection in the thickness-wise direction of the upper-side board-compressing member and the lower-side board-compressing member, only one lower-side supporting point be arranged within an upper-side unit region partitioned by adjacent 4 upper-side supporting points, and only one upper-side supporting point be arranged within a lower-side unit region partitioned by adjacent 4 lower-side supporting points.

In the inspection apparatus for circuit board according to the present invention, clearances between upper-side supporting points adjacent to each other related to the upper-side unit region, and between lower-side supporting points adjacent to each other related to the lower-side unit region may preferably be each 10 to 100 mm.

In inspection apparatus for circuit board according to the present invention, the upper-side base plate and lower-side base plate may preferably be each composed of a glass fiber-reinforced epoxy resin and have a thickness of 2 to 5 mm.

According to the present invention, there is still further provided an inspection process for circuit board, which comprises using the inspection apparatus for circuit board described above, and in a measurable state that an inspection object circuit board is compressed by the upper-side board-compressing member and lower-side board-compressing member by pressing the upper-side base plate and the lower-side base plate by the upper-side supports and the lower-side supports, respectively, deforming a complex stack composed of the inspection object circuit board and the upper-side board-compressing member and lower-side board-compressing member for compressing the inspection object circuit board by shifting in the thickness-wise direction together with the upper-side base plate and lower-side base plate, at positions, over the whole body, respectively pressed by the upper-side supports and lower-side supports in accordance with the upper-side supporting points and lower-side supporting points, so as to carry out measurement of electric resistance.

EFFECTS OF THE INVENTION

According to the inspection apparatus for circuit board of the present invention, points of application of the pressing force by the upper-side supports and points of application of the pressing force by the lower-side supports are formed at positions different from one another on the plane of projection in the thickness-wise direction of the upper-side board-compressing member and lower-side board-compressing member in the measurable state, and the complex stack, in which the inspection object circuit board is compressed, is, as it were, forcedly deformed together with the base plates in accordance with the upper-side supporting points and lower-side supporting points forming the points of application, thereby inhibiting the pressing force from concentrating on the points of application. As a result, since the pressure distribution in the inspection object circuit board is uniformed, a state that all the inspection object electrodes in the inspection object circuit board have been evenly electrically connected to inspection electrodes corresponding to each of the inspection object electrodes can be attained, so that the electrical inspection of the circuit board can be conducted with high accuracy.

Since both upper-side base plate and lower-side base plate are preferably made thinner for the purpose of achieving such a state, the weight of the whole inspection apparatus is made light by the reduction of the mass of the upper-side base plate and lower-side base plate.

Accordingly, according to the inspection apparatus for circuit board of the present invention, the thickness of the anisotropically conductive sheets can be made thin without involving defectiveness, so that the electrical inspection of a circuit board can be conducted with high reliability even when the circuit board has inspection object electrodes small in size and pitch or clearance, and moreover the weight saving of the measuring apparatus itself can be expected.

According to the inspection apparatus for circuit board of the present invention, the conduction between each of the inspection object electrodes in the inspection object circuit board and inspection electrode can be achieved with small pressing force to bring about the measurable state, so that durable strength in pressurization required of component members of the inspection apparatus may be made low. As a result, members relatively low in durable strength in pressurization can be used as the component members without involving defectiveness, whereby the miniaturization and simplification of the inspection apparatus itself can be planed, and reduction of cost can be expected.

Since the electrical inspection of the inspection object circuit board can be conducted with small pressing force, the deterioration of the anisotropically conductive sheets caused by repeated pressurization at every inspection can be inhibited. Accordingly, the frequency of replacement of the anisotropically conductive sheets in the inspection apparatus can be lessened, so that high inspection efficiency can be achieved, and inspection cost can be reduced.

Further, since thin base plates may preferably be used in the inspection apparatus for circuit board according to the present invention, even when the inspection apparatus has the construction that through-holes are formed in the base plates, the time required for the drilling operation can be shortened compared with an inspection apparatus equipped with thick base plates and the through-holes can be formed with high efficiency to attain high productivity.

DESCRIPTION OF CHARACTERS

Figure 1:
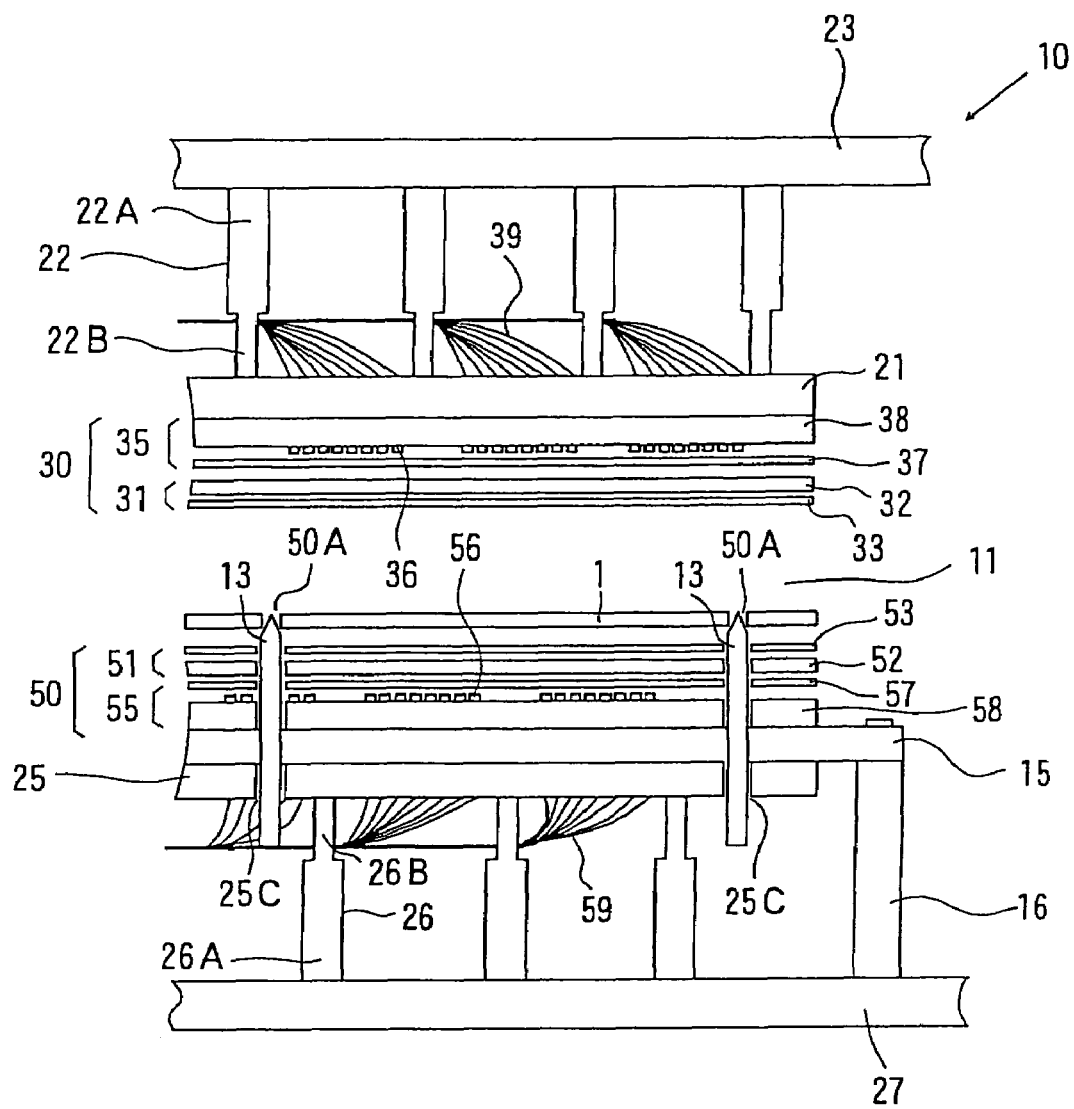
FIG. 1 illustrates the construction of an exemplary inspection apparatus for circuit board according to the present invention together with an inspection object circuit board.

1 Inspection object circuit board,
2 Upper-side electrodes to be inspected,
3 Lower-side electrodes to be inspected,
10 Inspection apparatus,
11 Inspection-executing region,
13 Positioning pins,
15 Alignment movable plate,
15A Substantially rectangular hole,
16 Alignment support,
19 Complex stack,
21 Upper-side base plate,
21A Upper-side supporting points, 21B Through-hole for inspection pin,
22 Upper-side supports,
22A Proximal part,
22B Tip part,
23 Upper-side support-infixing plate,
25 Lower-side base plate,
25A Projected part,
25B Lower-side supporting points,
25C Through-hole for positioning pin,
25D Through-hole for inspection pin,
26 Lower-side supports,
26A Proximal part,
26B Tip part,
27 Lower-side support-infixing plate,
30 Upper-side board-compressing member,
31 Upper-side adaptor,
32 Circuit board for inspection,
32A Electrodes for current supply,
32B Electrodes for voltage measurement,
32C Terminal electrodes,
32D Internal wiring part,
32E Positioning holes,
33 Anisotropically conductive sheet,
35 Upper-side inspection head,
36 Inspection pins,
36A Tip part,
36B Central part,
36C Large-diameter part,
36D Proximal part,
37 Anisotropically conductive sheet,
37A Conductive path-forming parts,
37B Insulating part,
38 Spacer board,
38A Through-hole for inspection pin,
39 wire,
50 Lower-side board-compressing member,
50A Through-hole for positioning pin,
51 Lower-side adaptor,
52 Circuit board for inspection,
52A Electrodes for current supply,
52B Electrodes for voltage measurement,
52C Terminal electrodes,
52D Internal wiring part,
53 Anisotropically conductive sheet,
55 Lower-side inspection head,
56 Inspection pins,
56A Tip part,
56B Central part,
56C Large-diameter part,
56D Proximal part,
57 Anisotropically conductive sheet,
58 Spacer board,
58A Through-hole for inspection pin,
59 Wire,
60 Upper-side board-compressing member,
61 Upper-side adaptor,
62 Circuit board for inspection,
62A Inspection electrodes,
62B Terminal electrodes,
62C Internal wiring part,
63 Upper-side inspection head,
64 Anisotropically conductive sheet,
65 Lower-side board-compressing member,
66 Lower-side adaptor,
67 circuit board for inspection,
67A Inspection electrodes,
67B Terminal electrodes,
67C Internal wiring part,
68 Lower-side inspection head,
69 Anisotropically conductive sheet,
70 Inspection apparatus,
71 Upper-side inspection head,
72 Electrode device,
73 Anisotropically conductive sheet,
74 Upper-side base plate,
75 Lower-side inspection head,
76 Electrode device,
77 Anisotropically conductive sheet,
78 Lower-side base plate,
79 Spacer,
80 Inspection object circuit board,
81, 82 Inspection object electrodes,
83 Power supply device,
84 Electric signal processor,
PA, PD Probes for current supply,
PB, PC Probes for voltage measurement,
90 Inspection apparatus,
91A Upper-side board-compressing member,
91B Lower-side board-compressing member,
92A, 92B Circuit boards for inspection,
93A, 93B Anisotropically conductive sheets,
94A, 94B Supports,
95A, 95B Support-infixing plates,
96A, 96B Base plates,
97A, 97B Supporting points,
98A, 98B Electrode devices,
99A, 99B Anisotropically conductive sheets,
100 Inspection apparatus,
101A Upper-side board-compressing member,
101B Lower-side board-compressing member,
102 Circuit board for inspection,
102A Inspection electrodes,
103 Anisotropically conductive sheet,
104 Supports,
105 Support-infixing plate,
106 Base plate,
107 Circuit board for inspection,
107A Inspection electrodes,
108 Electrode device,
109 Anisotropically conductive sheet.

BEST MODE FOR CARRYING OUT THE INVENTION

The mode for carrying out the present invention will hereinafter be described in detail.

Figure 2:
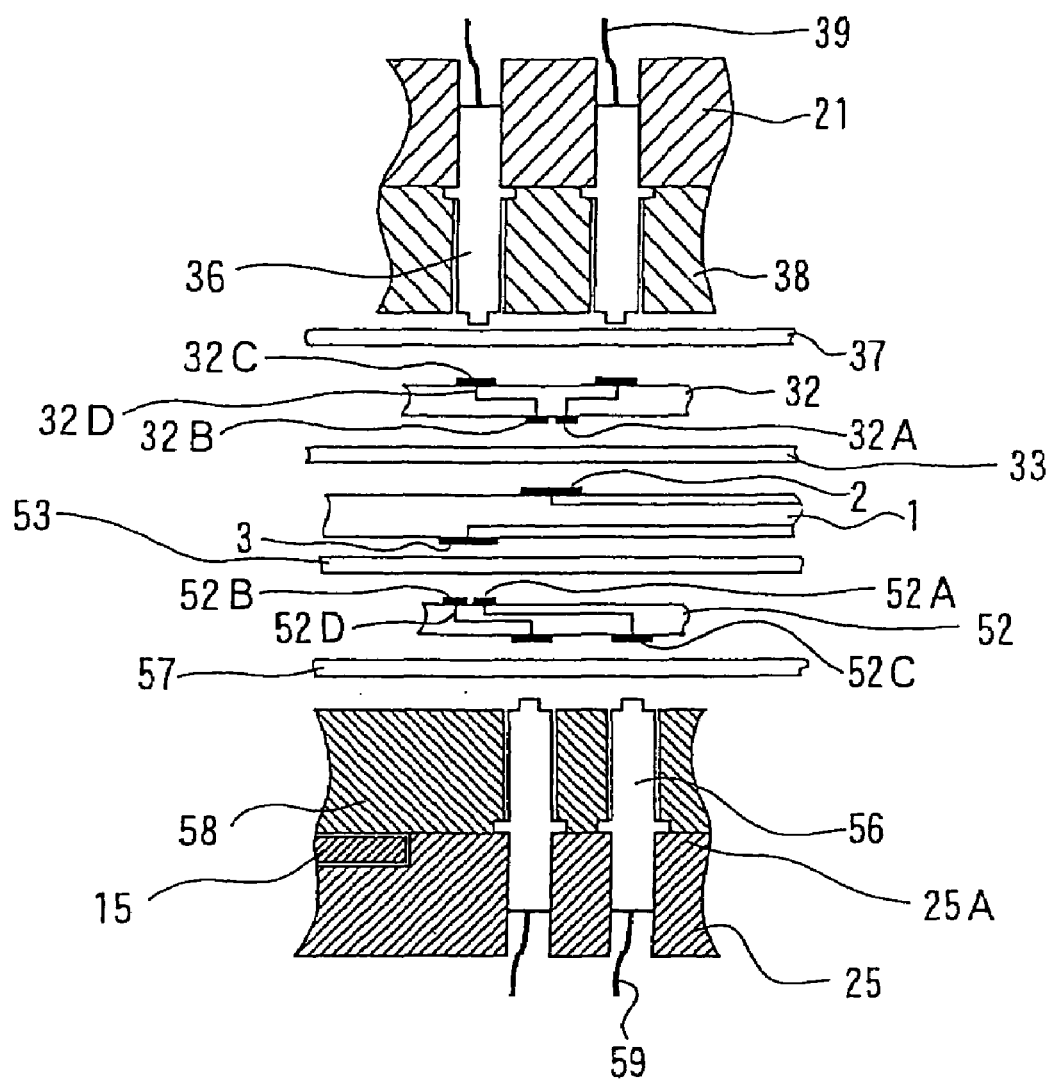
FIG. 2 is a cross-sectional view illustrating, on an enlarged scale, a part of the inspection apparatus for circuit board shown in FIG. 1.

FIG. 1 is a cross-sectional view illustrating the construction of an exemplary inspection apparatus for circuit board according to the present invention together with an inspection object circuit board, and FIG. 2 illustrates, on an enlarged scale, a part of the inspection apparatus for circuit board shown in FIG. 1.

This inspection apparatus (hereinafter also referred to as "first inspection apparatus") 10 is used for conducting electrical inspection of a circuit board by measuring electric resistance between electrodes in the circuit board. In this inspection apparatus, an upper-side board-compressing member 30 arranged on an upper side of an inspection object circuit board (circuit board to be inspected) 1 and provided with an anisotropically conductive sheet 33 on its front surface (lower surface in FIG. 1), and a lower-side board-compressing member 50 arranged on a lower side of the circuit board 1 to be inspected and provided with an anisotropically conductive sheet 53 on its front surface (upper surface in FIG. 1) are arranged so as to be vertically opposed to each other.

In the circuit board 1 to be inspected in this embodiment, upper-side electrodes 2 to be inspected are formed on its upper surface, and lower-side electrodes 3 to be inspected are formed on its lower surface. These lower-side electrodes 3 to be inspected are electrically connected to their corresponding upper-side electrodes 2 to be inspected.

Examples of the circuit board 1 to be inspected include those having flexibility, such as printed boards.

The degree of flexibility required of the circuit board 1 to be inspected is as follows.

Figure 3:
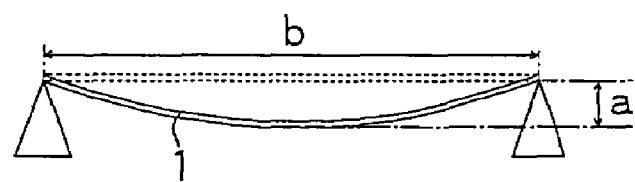
FIG. 3 illustrates the degree of flexibility required of an inspection object circuit board.

When the circuit board 1 to be inspected is horizontally arranged in a state that both ends of the circuit board 1 to be inspected have been supported at intervals of 10 cm as illustrated in FIG. 3, deflection a of the circuit board 1 to be inspected caused by pressurizing it by a pressure of 50 kgf from above is preferably at least 0.04% of the width b of the circuit board 1 to be inspected.

The upper-side board-compressing member 30 is provided on a front surface (lower surface in FIG. 1) of an upper-side base plate 21 supported by a plurality (4 supports are illustrated in FIG. 1) of upper-side supports 22 infixed into a flat plate-like upper-side support-infixing plate 23 composed of, for example, a laminate (trade name: "SUMI-LITE", product of SUMITOMO BAKELITE Co., Ltd.) of a phenol resin containing a fine thread cloth and vertically extending from the upper-side support-infixing plate 23.

In the embodiment illustrated, engaging recesses (not illustrated) each having an inner diameter fitted to an outer diameter of a tip part 22B of the upper-side support 22 are formed at positions where upper-side supporting points 21A, which will be described subsequently, should be formed, in a back surface (upper surface in FIG. 1) of the upper-side base plate 21. Engaging portions of the tip parts 22B of the upper-side supports 22 are inserted into and engaged with these engaging recesses, whereby the upper-side supporting points 21A are formed by the upper-side supports 22 on the upper-side base plate 21.

The lower-side board-compressing member 50 is provided on a front surface (upper surface in FIG. 1) of a lower-side base plate 25 supported by a plurality (3 supports are illustrated in FIG. 1) of lower-side supports 26 infixed into a flat plate-like lower-side support-infixing plate 27 composed of, for example, a laminate (trade name: "SUMI-LITE", product of SUMITOMO BAKELITE Co., Ltd.) of a phenol resin containing a fine thread cloth and vertically extending from the lower-side support-infixing plate 27.

In the embodiment illustrated, a substantially rectangular projected parts 25A (see FIG. 10) are formed in the whole region, in which a plurality of inspection pins 56 are arranged, on the front surface of the lower-side base plate 25. In a back surface (lower surface in FIG. 1) corresponding to the projected part 25A of the lower-side base plate 25, engaging recesses (not illustrated) each having an inner diameter fitted to an outer diameter of a tip part 26B of the lower-side support 26 are formed at positions where lower-side supporting points 25B, which will be described subsequently, should be formed. Engaging portions of the tip parts 26B of the lower-side supports 26 are inserted into and engaged with these engaging recesses, whereby the lower-side supporting points 25B are formed by the lower-side supports 26 on the lower-side base plate 25.

Incidentally, the engaging recesses in both upper-side base plate 21 and lower-side base plate 25 are not essential, and no engaging recess may be formed in each base plate.

The upper-side supporting point 21A related to the upper-side board-compressing member 30 and the lower-side supporting point 25B related to the lower-side board-compressing member 50 are arranged at different positions on a plane of projection (hereinafter also referred to as "specific plane of projection") in a thickness-wise direction of the upper-side board-compressing member 30 and lower-side board-compressing member 50 when the first inspection apparatus 10 is seen through from above (from above in FIG. 1).

The upper-side supporting points 21A and the lower-side supporting points 25B are preferably formed in the form of a lattice on the upper-side base plate 21 and on the lower-side base plate 25, respectively, as shown in the embodiment illustrated.

Figure 4:
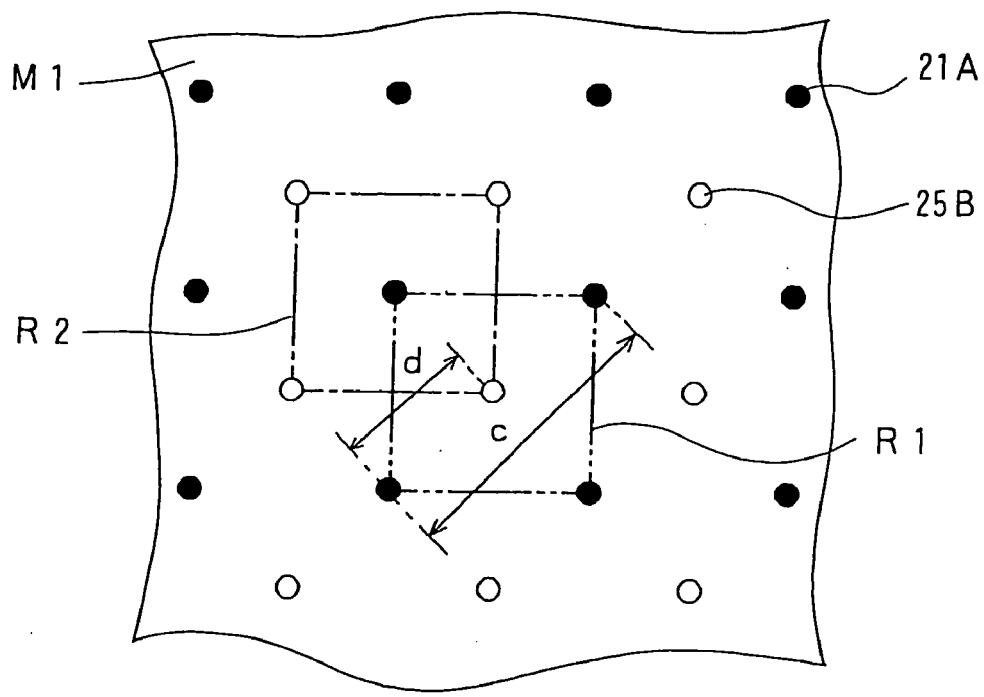
FIG. 4 illustrates a positional relation between upper-side supporting points and lower-side supporting points on a plane of projection in a thickness-wise direction of an upper-side board-compressing member and a lower-side board-compressing member when the inspection apparatus for circuit board shown in FIG. 1 is seen through from above.

Specifically, the upper-side supporting points 21A and the lower-side supporting points 25B are arranged in such a manner that as illustrated in FIG. 4, on the specific plane M1 of projection, only one lower-side supporting point 25B is arranged at a position where 2 diagonal lines intersect within a rectangular upper-side unit region R1 partitioned by adjacent 4 upper-side supporting points 21A, and only one upper-side supporting point 21A is arranged at a position where 2 diagonal lines intersect within a rectangular lower-side unit region R2 partitioned by adjacent 4 lower-side supporting points 25B. In FIG. 4, the upper-side supporting points 21A and the lower-side supporting points 25B are indicated by a black circle and a white circle, respectively, and one upper-side unit region R1 and one lower-side unit regions R2 are each surrounded by an alternate long and short dashed line.

In the inspection apparatus, clearances between upper-side supporting points 21A adjacent to each other and between lower-side supporting points 25B adjacent to each other are each preferably 10 to 100 mm, more preferably 12 to 70 mm, particularly preferably 15 to 50 mm.

Those having flexibility are used as the upper-side base plate 21 and lower-side base plate 25.

The degree of flexibility required of the upper-side base plate 21 and lower-side base plate 25 (hereinafter also referred to as "specific base plates") is as follows.

When the specific base plate is horizontally arranged in a state that both ends of the specific base plate have been supported at intervals of 10 cm (see FIG. 3), deflection of the specific base plate caused by pressurizing it by a pressure of 50 kgf from above is preferably at least 0.02% of the width of the specific base plate, and it preferably undergoes neither breakage nor permanent set even when it is pressurized by a pressure of 50 kgf from above.

More specifically, as a material for the upper-side base plate 21 and lower-side base plate 25, is used an insulating material having a resistivity of at least $1 \times 10^{10}$ Ω·cm, for example, a resin material having high mechanical strength, such as a polyimide resin, polyester resin, polyamide resin, phenol resin, polyacetal resin, poly(butylene terephthalate) resin, poly(ethylene terephthalate) resin, syndiotactic polystyrene resin, poly(phenylene sulfide) resin, poly(ether ethyl ketone) resin, fluorocarbon resin, poly(ether nitrile) resin, poly(ether sulfone) resin, polyacrylate resin or polyamide-imide resin, a glass fiber-reinforced composite resin material such as a glass fiber-reinforced epoxy resin, glass fiber-reinforced polyester resin, glass fiber-reinforced polyimide resin, glass fiber-reinforced phenol resin or glass fiber-reinforced fluorocarbon resin, a carbon fiber-reinforced composite resin such as a carbon fiber-reinforced epoxy resin, carbon fiber-reinforced polyester resin, carbon fiber-reinforced polyimide resin, carbon fiber-reinforced phenol resin or carbon fiber-reinforced fluorocarbon resin, a composite resin material obtained by filling an inorganic material such as silica, alumina or boron nitride into an epoxy resin, phenol resin or the like, or a composite resin material obtained by containing mesh in an epoxy resin, phenol resin or the like. A composite plate material formed by laminating a plurality of plates composed of any of these materials may also be used.

The thickness of each of the upper-side base plate 21 and lower-side base plate 25 is suitably selected according to the kind of the material forming the upper-side base plate 21 or lower-side base plate 25. However, it is, for example, 1 to 10 mm.

In the embodiment illustrated, "the thickness of the lower-side base plate 25" indicates a thickness of a portion where the projected part 25A is formed. The projected height of this projected part 25A is preferably 0.5 to 5 mm.

In particular, when each of the upper-side base plate 21 and lower-side base plate 25 has the construction that through-holes are formed as the first inspection apparatus 10, the thickness thereof is preferably at most 5 mm.

When the thickness of a base plate, in which through-holes should be formed, is 5 mm or thinner, through-holes can be formed with high efficiency by one drilling operation without involving bad effects such as damage or breakage of a drill bit, thereby it is unnecessary to conduct the drilling operation plural times for forming one through-hole. Accordingly, the inspection apparatus equipped with base plates having a thickness of 5 or thinner can shorten the time required for the drilling operation compared with an inspection apparatus equipped with thick base plates and moreover can be produced with high production efficiency because the through-holes can be formed with high efficiency.

Specific preferable examples of the upper-side base plate 21 and lower-side base plate 25 include those composed of a glass fiber-reinforced epoxy resin and having a thickness of 2 to 5 mm.

As the upper-side supports 22 and lower-side supports 26, may be used columnar bodies composed of a material such as brass, aluminum, titanium, stainless steel, copper, iron or an alloy thereof.

These upper-side supports 22 and lower-side supports 26 preferably have an overall length of 10 to 100 mm.

A plurality of the upper-side supports 22 making up the first inspection apparatus 10 may have different overall lengths so far as they are capable of achieving a specific measurable state. Likewise, a plurality of the lower-side supports 26 may have different overall lengths.

An outer diameter of a tip part 22B forming the upper-side supporting points 21A or a tip part 26B forming the lower-side supporting points 25B is preferably 1 to 10 mm, respectively, and the outer diameter of the tip part 22B of the upper-side support 22 is preferably the same as the outer diameter of the tip part 26B of the lower-side support 26.

In the embodiment illustrated, each upper-side support 22 is composed of a proximal part 22A fixed to the upper-side support-infixing plate 23 and a tip part 22B that is continuous with this proximal part 22A, forms an upper-side supporting point 21A by its tip surface and has a diameter smaller than the proximal part 22A. On the other hand, each lower-side support 26 is composed of a proximal part 26A fixed to the lower-side support-infixing plate 27 and a tip part 26B that is continuous with this proximal part 26A, forms an lower-side supporting point 25B by its tip surface and has a diameter smaller than the proximal part 26A.

These upper-side support 22 and lower-side support 26 are those having the tip parts 22B and 26B of the same outer diameter.

The upper-side board-compressing member 30 making up the first inspection apparatus 10 is constructed by arranging an upper-side adaptor 31 and an upper-side inspection head 35 in this order from below in FIG. 1.

Figure 5:
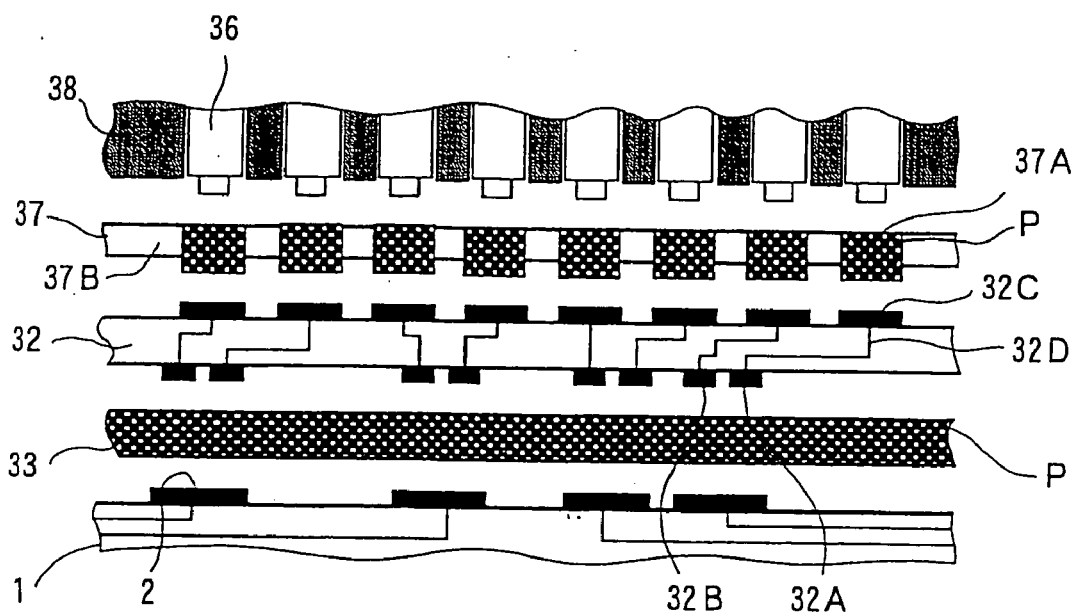
FIG. 5 illustrates an upper-side adaptor in the upper-side board-compressing member making up the inspection apparatus for circuit board shown in FIG. 1 together with an upper-side inspection head and the inspection object circuit board.

As illustrated in FIG. 5, the upper-side adaptor 31 is constructed by a circuit board 32 for inspection and an elastic anisotropically conductive sheet 33 arranged on a front surface (lower surface in FIGS. 1 and 5) of the circuit board 32 for inspection by being fixed by a proper means.

Figure 6:
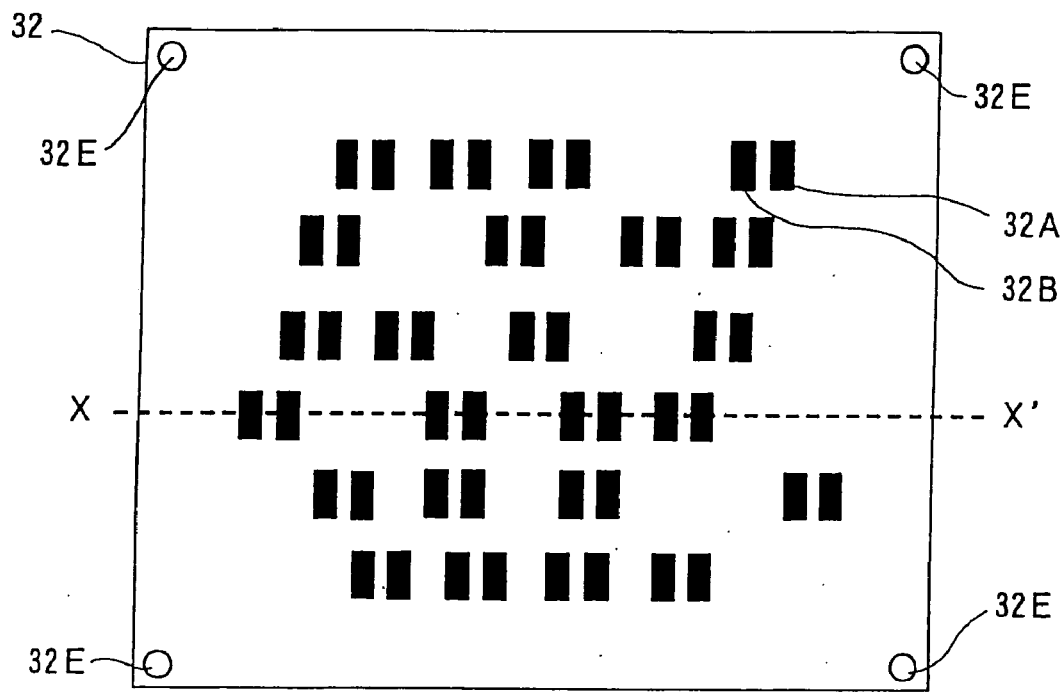
FIG. 6 illustrates a front surface of a circuit board for inspection in the inspection apparatus for circuit board shown in FIG. 1.

On the front surface of the circuit board 32 for inspection in the upper-side adaptor 31, electrodes 32A for current supply and electrodes 32B for voltage measurement making up an inspection electrode pair are, in a state separated from each other, arranged in accordance with an arrangement pattern of the upper-side electrodes 2 to be inspected on the upper surface of the circuit board 1 to be inspected so as to be located, in relation with one upper-side electrode 2 to be inspected, within a region of an area equal to a region occupied by the upper-side electrode 2 to be inspected as illustrated in FIG. 6.

In FIG. 6, reference numeral 32E designates a positioning hole.

A clearance between the electrode 32A for current supply and the electrode 32B for voltage measurement in the circuit board 32 for inspection is preferably at least 10 μm. If this clearance is shorter than 10 μm, a current flowing between the electrode 32A for current supply and the electrode 32B for voltage measurement through the anisotropically conductive sheet 33 becomes high, so that it may be difficult in some cases to measure electric resistance with high precision.

On the other hand, the upper limit of the clearance is determined by the sizes of the respective inspection electrodes and the size and pitch of their related upper-side electrodes 2 to be inspected, and is generally at most 500 μm. If this clearance is too large, it is difficult to suitably arrange both inspection electrodes correspondingly to one small-sized upper-side electrode 2 to be inspected.

Figure 7:
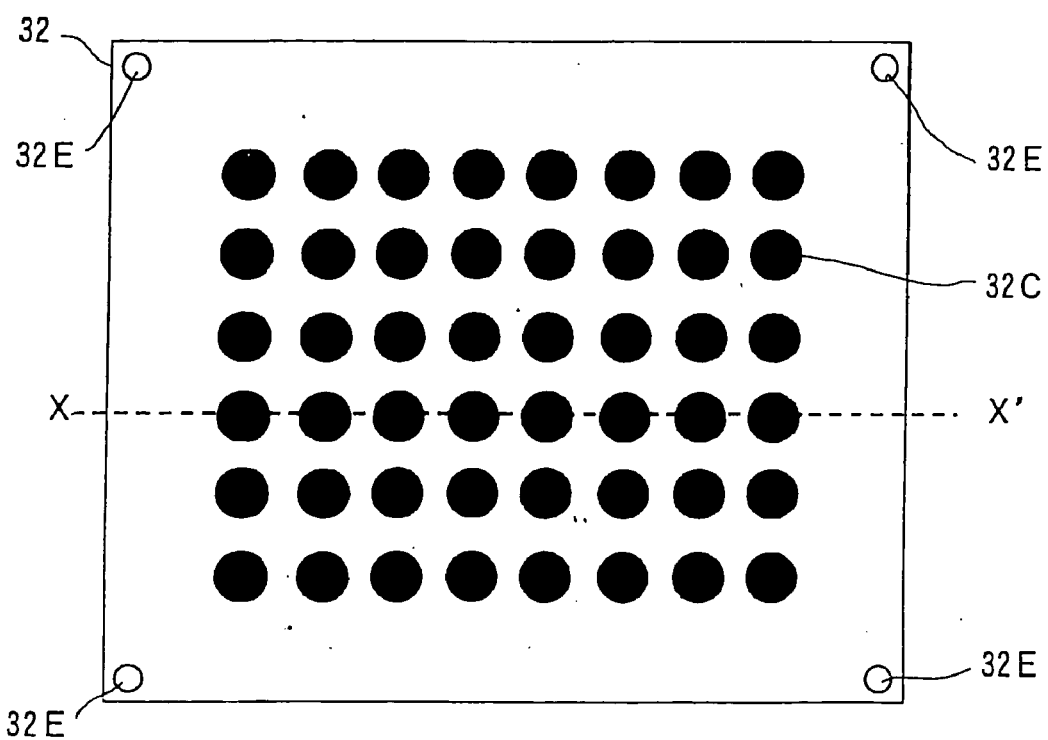
FIG. 7 illustrates a back surface of the circuit board for inspection in the inspection apparatus for circuit board shown in FIG. 1.
Figure 8:
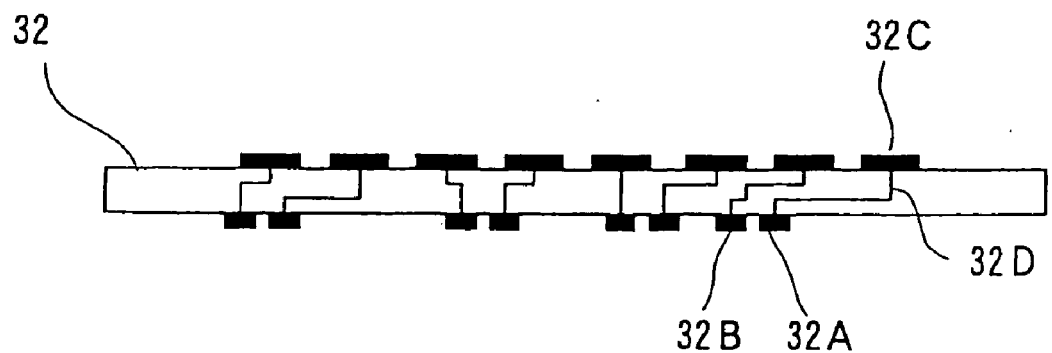
FIG. 8 is a cross-sectional view taken along line X-X' of the circuit board for inspection shown in FIGS. 6 and 7.

On a back surface (upper surface in FIGS. 1 and 5) of the circuit board 32 for inspection, a plurality of terminal electrodes 32C are arranged according to positions of lattice points having a pitch of, for example, 0.2 mm, 0.3 mm, 0.45 mm, 0.5 mm, 0.75 mm, 0.8 mm, 1.06 mm, 1.27 mm, 1.5 mm, 1.8 mm or 2.54 mm as illustrated in FIG. 7. These terminal electrodes 32C are each electrically connected to its corresponding electrode 32A for current supply or electrode 32B for voltage measurement through an internal wiring part 32D.

The anisotropically conductive sheet 33 in the upper-side adaptor 31 is the so-called dispersion type anisotropically conductive sheet that conductive particles P are contained in a base material composed of an elastic polymeric substance having insulating property in a state oriented so as to align in a thickness-wise direction of the anisotropically conductive sheet 33, and conductive paths are formed by chains of the conductive particles P when the sheet is pressurized in the thickness-wise direction in the measurable state.

In this description, the term "measurable state" means a state that the circuit board 1 to be inspected is compressed between, for example, the upper-side board-compressing member 30 and the lower-side board-compressing member 50, whereby the anisotropically conductive sheet is pressed in the thickness-wise direction thereof.

The anisotropically conductive sheet 33 preferably has higher conductivity in its thickness-wise direction than that in a plane direction perpendicular to the thickness-wise direction. Specifically, the anisotropically conductive sheet preferably has electrical properties that a ratio of the electric resistance value in the plane direction to the electric resistance value in the thickness-wise direction is 1 or lower, particularly 0.5 or lower.

If the ratio exceeds 1, a current flowing between the electrode 32A for current supply and the electrode 32B for voltage measurement through such an anisotropically conductive sheet 33 becomes high, so that it may be difficult in some cases to measure electric resistance with high precision.

The upper-side inspection head 35 has a plurality of inspection pins 36 arranged at positions of lattice points of the same pitch as the terminal electrodes 32C of the upper-side adaptor 31, and an elastic anisotropically conductive sheet 37 is arranged on a front surface (lower surface in FIG. 1) of the head by being fixed by a proper means.

Figure 9:
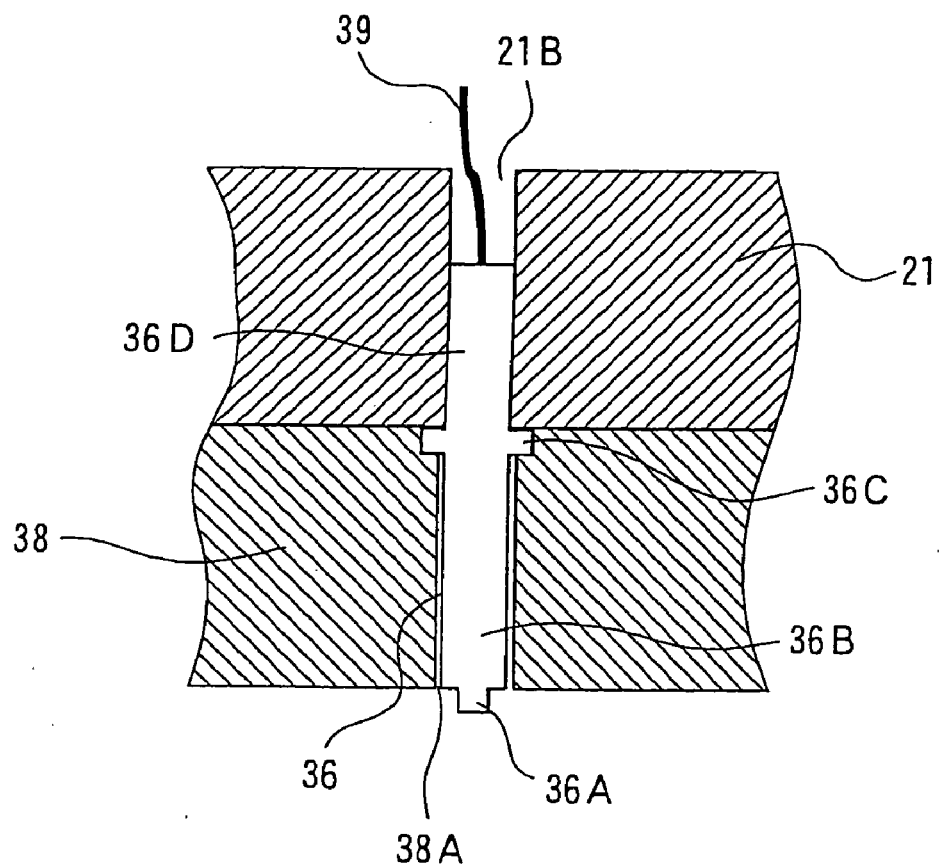
FIG. 9 is a cross-sectional view illustrating an inspection pin making up the upper-side board-compressing member of the inspection apparatus for circuit board shown in FIG. 1.

Each of the inspection pins 36 is composed of a columnar tip part 36A, a central part 36B, which is continuous with the tip part 36A and has a diameter larger than the tip part 36A, a large-diameter part 36C, which is continuous with the central part 36B and has a diameter larger than the central part 36B, and a proximal part 36D, which is continuous with the large-diameter part 36C and has the same outer diameter as the central part 36B as illustrated in FIG. 9.

This inspection pin 36 is fixed in a state that the tip part 36A has been projected from a front surface (lower surface in FIG. 9) of a plate-like spacer board 38 arranged on a front surface (lower surface in FIG. 9) of the upper-side base plate 21 by inserting the proximal part 36D of the inspection pin 36 into a through-hole 21B for inspection pin in the upper-side base plate 21, which has an inner diameter fitted to the outer diameter of the proximal part 36D and is formed at a position of a lattice point having a pitch, at which the inspection pin 36 should be arranged, and inserting the central part 36B and large-diameter part 36C of the inspection pin 36 into a through-hole 38A for inspection pin formed in the spacer board 38 and having a form fitted to the central part 36B and large-diameter part 36C.

Each of the inspection pins 36 is electrically connected to a connector (not illustrated) provided on the upper-side support-infixing plate 23 through a wire 39 electrically connected to the proximal part 36D and further electrically connected to a tester (not illustrated) through the connector.

The anisotropically conductive sheet 37 in the upper-side inspection head 35 is the so-called uneven distribution type anisotropically conductive sheet composed of conductive path-forming parts 37A with conductive particles P contained at a high density in a base material composed of an elastic polymeric substance having insulating property, and an insulating part 37B that the conductive particles P do not exist at all or scarcely exist in a base material composed of an elastic polymeric substance having insulating property, and having the construction that a plurality of columnar conductive path-forming parts 37A formed in accordance with a pattern corresponding to the terminal electrodes 32C and each having a surface of an area equal to a region occupied by the terminal electrode 32C are mutually insulated by the insulating part 37B. When the conductive path-forming parts 37A are brought into contact with the surfaces (upper surfaces in FIG. 5) of their corresponding terminal electrodes 32C and pressurized in the thickness-wise direction thereof in the measurable state, conductive paths are formed by respective chains of the conductive particles P.

In the embodiment illustrated, the anisotropically conductive sheet 37 has an irregular shape that the surfaces (lower surfaces in FIG. 5) of the conductive path-forming parts 37A are projected from the surface (lower surface in FIG. 5) of the insulating part 37B on one surface (lower surface in FIG. 5) of the side of the circuit board 32 for inspection.

The upper-side board-compressing member 30 of the construction described above can be constructed by arranging the spacer board 38, in which a plurality of the through-holes 38A for inspection pin have been formed, the anisotropically conductive sheet 37, the circuit board 32 for inspection and the anisotropically conductive sheet 33 at prescribed positions in this order on the front surface of the upper-side base plate 21 in a state that the inspection pins 36 have been inserted into the through-holes 21B for inspection pin formed by the drilling operation.

The lower-side board-compressing member 50 making up the first inspection apparatus 10 is constructed by arranging a lower-side adaptor 51 and a lower-side inspection head 55 in this order from above in FIG. 1.

In the embodiment illustrated, the lower-side board-compressing member 50 has a circuit board-holding mechanism for holding the circuit board 1 to be inspected in an inspection-executing region 11 formed between the upper-side board-compressing member 30 and the lower-side board-compressing member 50. In this circuit board-holding mechanism, positioning pins 13 for arranging the circuit board 1 to be inspected at an exact position in the inspection-executing region 11 are provided in a state that they have been fixed to an alignment movable plate 15 located between the lower-side inspection head 55 and the lower-side base plate 25 and each have been inserted through a through-hole 50A for positioning pin formed in the lower-side board-compressing member 50 and a through-hole 25C for positioning pin formed in the lower-side base plate 25.

Figure 10:
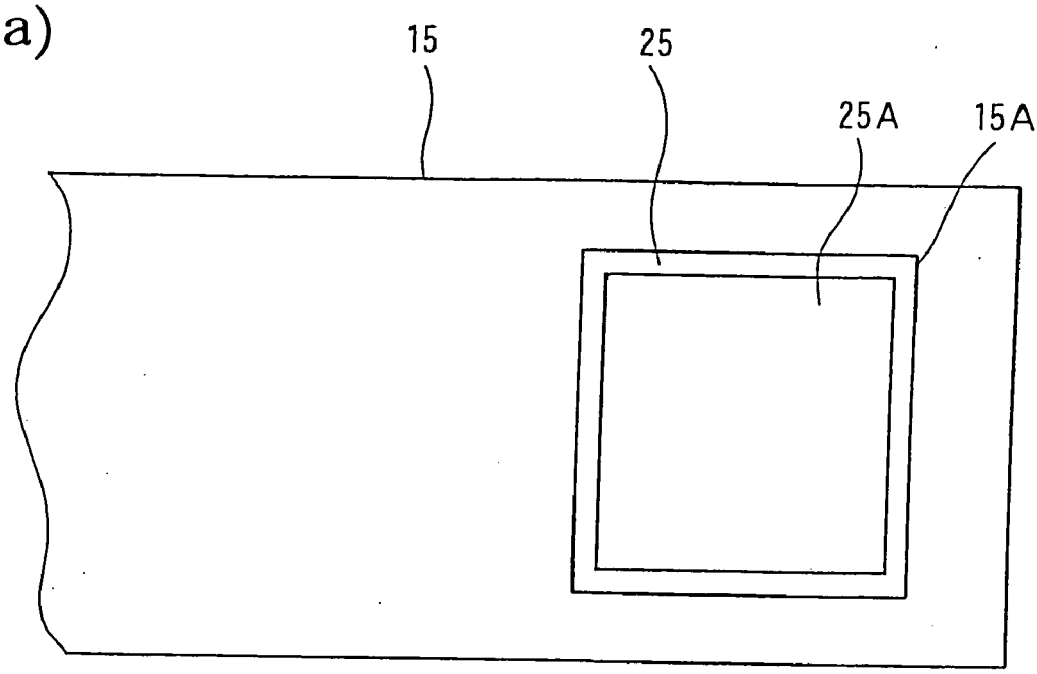
FIG. 10(a) is a plan view illustrating a positional relation between a projected part of a lower-side base plate and an alignment movable plate.
FIG. 10(b) is a cross-sectional view illustrating a positional relation between a projected part of a lower-side base plate and an alignment movable plate.
Figure 10:
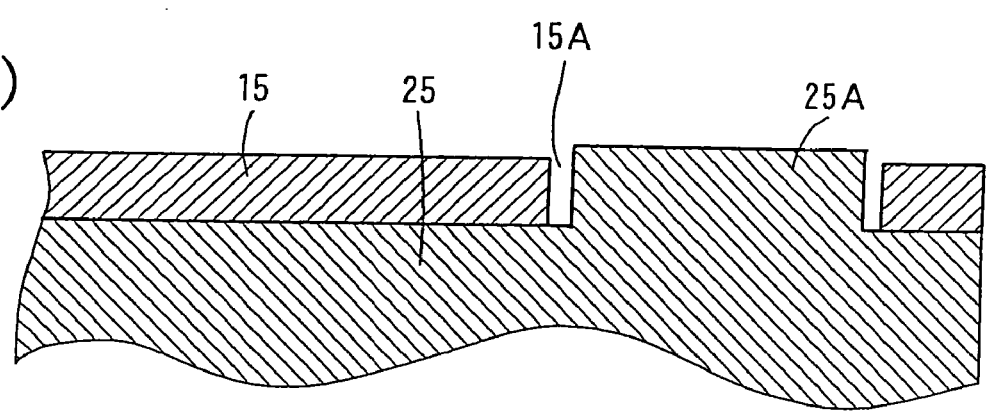

The alignment movable plate 15 has a thickness fitted to the projected height of the projected part 25A of the lower-side base plate 25 and is supported by an alignment support 16 movably fixed to the lower-side base plate 25. The alignment movable plate 15 is arranged in a state that the projected part 25A of the lower-side base plate 25 has been inserted into a substantially rectangular hole 15A formed at a position corresponded to the projected part 25A and having a size fitted to the projected part 25A as illustrated in FIG. 10.

The lower-side adaptor 51 is constructed by a circuit board 52 for inspection and an elastic anisotropically conductive sheet 53 arranged on a front surface (upper surface in FIG. 1) of the circuit board 52 for inspection by being fixed by a proper means.

On the front surface of the circuit board 52 for inspection in the lower-side adaptor 51, electrodes 52A for current supply and electrodes 52B for voltage measurement making up an inspection electrode pair are, in a state separated from each other, arranged in accordance with an arrangement pattern of the lower-side electrodes 3 to be inspected on the lower surface of the circuit board 1 to be inspected so as to be located, in relation with one lower-side electrode 3 to be inspected, within a region of an area equal to a region occupied by the lower-side electrode 3 to be inspected.

A clearance between the electrode 52A for current supply and the electrode 52B for voltage measurement in the circuit board 52 for inspection is preferably at least 10 µm. If this clearance is shorter than 10 µm, a current flowing between the electrode 52A for current supply and the electrode 52B for voltage measurement through the anisotropically conductive sheet 53 becomes high, so that it may be difficult in some cases to measure electric resistance with high precision.

On the other hand, the upper limit of the clearance is determined by the sizes of the respective inspection electrodes and the size and pitch of their related lower-side electrodes 3 to be inspected, and is generally at most 500 μm. If this clearance is too large, it is difficult to suitably arrange both inspection electrodes correspondingly to one small-sized lower-side electrode 3 to be inspected.

On a back surface (lower surface in FIG. 1) of the circuit board 52 for inspection, a plurality of terminal electrodes 52C are arranged according to positions of lattice points having a pitch of, for example, 0.2 mm, 0.3 mm, 0.45 mm, 0.5 mm, 0.75 mm, 0.8 mm, 1.06 mm, 1.27 mm, 1.5 mm, 1.8 mm or 2.54 mm. These terminal electrodes 52C are each electrically connected to its corresponding electrode 52A for current supply or electrode 52B for voltage measurement through an internal wiring part 52D.

The anisotropically conductive sheet 53 in the lower-side adaptor 51 is the so-called dispersion type anisotropically conductive sheet that conductive particles P are contained in a base material composed of an elastic polymeric substance having insulating property in a state oriented so as to align in a thickness-wise direction of the anisotropically conductive sheet 53, and conductive paths are formed by chains of the conductive particles when the sheet is pressurized in the thickness-wise direction in the measurable state.

The anisotropically conductive sheet 53 preferably has higher conductivity in its thickness-wise direction than that in a plane direction perpendicular to the thickness-wise direction. Specifically, the anisotropically conductive sheet preferably has electrical properties that a ratio of the electric resistance value in the plane direction to the electric resistance value in the thickness-wise direction is 1 or lower, particularly 0.5 or lower.

If the ratio exceeds 1, a current flowing between the electrode 52A for current supply and the electrode 52B for voltage measurement through the anisotropically conductive sheet 53 becomes high, so that it may be difficult in some cases to measure electric resistance with high precision.

The lower-side inspection head 55 has a plurality of inspection pins 56 arranged at positions of lattice points of the same pitch as the terminal electrodes 52C of the lower-side adaptor 51, and an elastic anisotropically conductive sheet 57 is arranged on a front surface (upper surface in FIG. 1) of the head by being fixed by a proper means.

Figure 11:
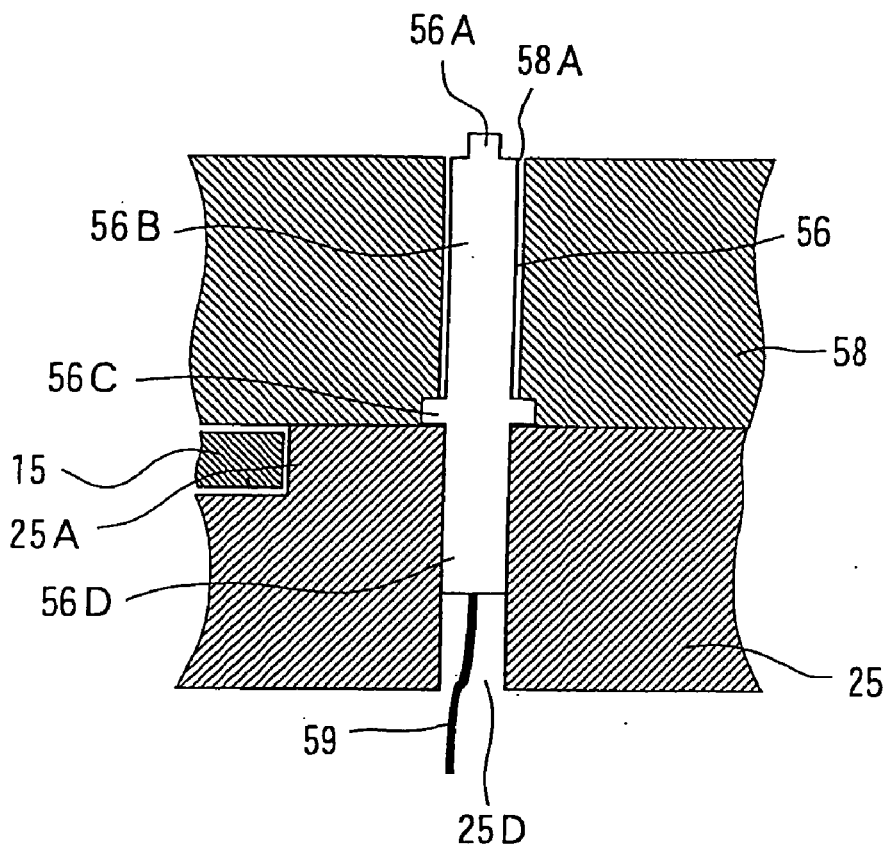
FIG. 11 is a cross-sectional view illustrating an inspection pin making up the lower-side board-compressing member of the inspection apparatus for circuit board shown in FIG. 1.

Each of the inspection pins 56 is composed of a columnar tip part 56A, a central part 56B, which is continuous with the tip part 56A and has a diameter larger than the tip part 56A, a large-diameter part 56C, which is continuous with the central part 56B and has a diameter larger than the central part 56B, and a proximal part 56D, which is continuous with the large-diameter part 56C and has the same outer diameter as the central part 56B as illustrated in FIG. 11.

This inspection pin 56 is fixed in a state that the tip part 56A has been projected from a front surface (upper surface in FIG. 11) of a spacer board 58 arranged on a front surface (upper surface in FIG. 11) of the lower-side base plate 25 by inserting the proximal part 56D of the inspection pin 56 into a through-hole 25D for inspection pin in the lower-side base plate 25, which has an inner diameter fitted to the outer diameter of the proximal part 56D and is formed at a position of a lattice point having a pitch, at which the inspection pin 56 should be arranged, and inserting the central part 56B and large-diameter part 56C of the inspection pin 56 into a through-hole 58A for inspection pin formed in the spacer board 58 and having a form fitted to the central part 56B and large-diameter part 56C.

Each of the inspection pins 56 is electrically connected to a connector (not illustrated) provided on the lower-side support-infixing plate 27 through a wire 59 electrically connected to the proximal part 56D and further electrically connected to a tester (not illustrated) through the connector.

The anisotropically conductive sheet 57 in the lower-side inspection head 55 has the same construction as the anisotropically conductive sheet 37 in the upper-side inspection head 35 and is the so-called uneven distribution type anisotropically conductive sheet composed of conductive path-forming parts with conductive particles contained at a high density in a base material composed of an elastic polymeric substance having insulating property, and an insulating part that the conductive particles do not exist at all or scarcely exist in a base material composed of an elastic polymeric substance having insulating property, and having the construction that a plurality of columnar conductive path-forming parts formed in accordance with a pattern corresponding to the terminal electrodes 52C and each having a surface of an area equal to a region occupied by the terminal electrode 52C are mutually insulated by the insulating part. When the conductive path-forming parts are brought into contact with the surfaces of their corresponding terminal electrodes 52C and pressurized in the thickness-wise direction thereof in the measurable state, conductive paths are formed by respective chains of the conductive particles.

In this embodiment, the anisotropically conductive sheet 57 has an irregular shape that the surfaces of the conductive path-forming parts are projected from the surface of the insulating part on one surface of the side of the circuit board 52 for inspection.

The lower-side board-compressing member 50 of the construction described above can be constructed by arranging the alignment movable plate 15, in which the substantially rectangular hole 15A has been formed, the spacer board 58, in which a plurality of the through-holes 58A for inspection pin have been formed, the anisotropically conductive sheet 57, the circuit board 52 for inspection and the anisotropically conductive sheet 53 at prescribed positions in this order on the front surface of the lower-side base plate 25 in a state that the inspection pins 56 have been inserted into the through-holes 25D for inspection pin formed at the projected part 25A by the drilling operation.

The elastic polymeric substances forming the base materials of the anisotropically conductive sheets making up the first inspection apparatus 10 are preferably polymeric substances having a crosslinked structure. As curable polymeric substance-forming materials usable for obtaining crosslinked polymeric substances, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and besides chloroprene, urethane rubber, polyester rubber, epichlorohydrin rubber, silicone rubber, ethylene-propylene copolymer rubber and ethylene-propylene-diene terpolymer rubber.

When weather resistance is required of the resulting anisotropically conductive sheet in the embodiment described above, any other material than conjugated diene rubbers is preferably used. In particular, silicone rubber is preferably used from the viewpoints of forming and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those containing a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and successively fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and successively fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosilane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such an elastic polymeric substance preferably has a molecular weight Mw (weight average molecular weight as determined in terms of standard polystyrene equivalent) of 10,000 to 40,000. It also preferably has a molecular weight distribution index (a ratio Mw/Mn of weight average molecular weight Mw as determined in terms of standard polystyrene equivalent to number average molecular weight Mn as determined in terms of standard polystyrene equivalent) of at most 2 from the viewpoint of heat resistance of the resulting anisotropically conductive sheet.

In the above, a curing catalyst for curing the polymeric substance-forming material may be contained in the sheet-forming material for obtaining the anisotropically conductive sheet. As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or triorganophosphite and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by mass per 100 parts by mass of the polymeric substance-forming material.

In the sheet-forming material, as needed, may be contained an ordinary inorganic filler such as silica powder, colloidal silica, aerogel silica or alumina. By containing such an inorganic filler, the thixotropic property of such a sheet-forming material is ensured, the viscosity thereof becomes high, the dispersion stability of the conductive particles is improved, and moreover the strength of the resulting anisotropically conductive sheet can be made high.

No particular limitation is imposed on the amount of such an inorganic filler used. However, the use in a too great amount is not preferred because the orientation of the conductive particles by a magnetic field cannot be sufficiently achieved.

The viscosity of the sheet-forming material is preferably within a range of 100,000 to 1,000,000 cP at a temperature of 25° C.

As the conductive particles, those exhibiting magnetism are used from the viewpoint of permitting them to be easily oriented so as to align in a thickness-wise direction of the resulting anisotropically conductive sheet by applying a magnetic field. Specific examples of such conductive particles include particles of metals exhibiting magnetism, such as nickel, iron and cobalt and particles of alloys thereof, particles containing such a metal, particles obtained by using these particles as core particles and plating surfaces of the core particles with a metal having good conductivity, such as gold, silver, palladium or rhodium, particles obtained by using particles of a non-magnetic metal, particles of an inorganic substance, such as glass beads, or particles of a polymer as core particles and plating surfaces of the core particles with a conductive magnetic substance such as nickel or cobalt, and particles obtained by coating the core particles with both conductive magnetic substance and metal having good conductivity.

Among these, particles obtained by using particles composed of a ferromagnetic substance, for example, nickel particles as core particles and plating their surfaces with a metal having good conductivity, particularly gold are preferably used.

No particular limitation is imposed on a means for coating the surfaces of the core particles with the conductive metal. However, the coating may be conducted by, for example, chemical plating or electroplating.

When those obtained by coating the surfaces of the core particles with the conductive metal are used as the conductive particles, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to coat is preferably 0.5 to 50% by mass, more preferably 1 to 30% by mass, still more preferably 3 to 25% by mass, particularly preferably 4 to 20% by mass based on the core particles. When the conductive metal to coat is gold, the coating amount thereof is preferably 2.5 to 30% by mass, more preferably 3 to 20% by mass, still more preferably 3.5 to 17% by mass based on the core particles.

The water content in the conductive particles is preferably at most 5%, more preferably at most 3%, still more preferably at most 2%, particularly preferably at most 1%. The use of conductive particles satisfying such conditions prevents or inhibits occurrence of bubbles upon a curing treatment of the polymeric substance-forming material.

The conductive particles are preferably contained in a proportion of 5 to 60%, more preferably 8 to 50%, particularly preferably 10 to 40% in terms of volume fraction.

The electric resistance in the thickness-wise direction of the anisotropically conductive sheet is preferably at most 100 mΩ in a state that the anisotropically conductive sheet has been pressurized in the thickness-wise direction under a load of 10 to 20 gf.

The thickness of each of the anisotropically conductive sheet 33 making up the upper-side adaptor 31, and the anisotropically conductive sheet 53 making up the lower-side adaptor 51 is preferably 0.05 to 0.2 mm.

The thickness of each of the anisotropically conductive sheet 37 making up the upper-side inspection head 35, and the anisotropically conductive sheet 57 making up the lower-side inspection head 55 is preferably 0.1 to 1.5 mm.

The thickness of each of the anisotropically conductive sheets 37 and 57 means a thickness of each conductive path-forming part; and the projected height of the conductive path-forming part from the surface of the insulating part is preferably 0.02 to 1.3 mm.

The dispersion type anisotropically conductive sheets making up the first inspection apparatus 10 can be produced in the following manner.

A flowable sheet-forming material is prepared by dispersing conductive particles in a polymeric substance-forming material, which will become an elastic polymeric substance by a curing treatment, and conducting a defoaming treatment by pressure reduction as needed. This sheet-forming material prepared in such a manner is poured into a molding cavity of a mold for molding of an anisotropically conductive sheet to form a sheet-forming material layer in a state that the conductive particles have been dispersed. For example, a pair of electromagnets are then arranged on an upper surface and a lower surface of the mold, and the electromagnets are operated, thereby applying a parallel magnetic field to the sheet-forming material layer in its thickness-wise direction to orient the conductive particles dispersed in the sheet-forming material layer so as to align in the thickness-wise direction. In this state, the sheet-forming material layer is subjected to a curing treatment, thereby producing an anisotropically conductive sheet with the conductive particles oriented in the elastic polymeric substance so as to align in the thickness-wise direction.

The uneven distribution type anisotropically conductive sheets making up the first inspection apparatus 10 can be produced in the following manner.

For example, a mold for molding of anisotropically conductive sheet, which is composed of a top force and a bottom force each having a form of a substantially flat plate as a whole and corresponding to each other, and has the construction that a material layer filled into a molding cavity between the top force and the bottom force can be cured by heating while applying a magnetic field to the material layer, is provided.

In order to form portions having conductivity at proper positions by applying a magnetic field to the material layer, in this mold for molding of the anisotropically conductive sheet, both top force and bottom force have the construction having a mosaic layer formed by arranging ferromagnetic substance portions formed of iron, nickel or the like for causing an intensity distribution in the magnetic field within the mold and non-magnetic portions formed of a non-magnetic metal such as copper, or a resin alternatively so as to adjoin each other on a base plate composed of a ferromagnetic substance such as iron or nickel. The ferromagnetic substance portions are arranged in accordance with a pattern corresponding to a pattern of conductive path-forming parts to be formed.

The molding surface of the top force is flat, while the molding surface of the bottom force has slight irregularities corresponding to the conductive path-forming parts to be formed in the anisotropically conductive sheet.

The above-described mold for molding the anisotropically conductive sheet is used to produce an anisotropically conductive sheet in the following manner.

A molding material obtained by containing conductive particles exhibiting magnetism in a polymeric substance-forming material, which will become an elastic polymeric substance by being cured, is first filled into the molding cavity of the mold for molding the anisotropically conductive sheet to form a molding material layer.

The ferromagnetic substance portions and non-magnetic substance portions in each of the top force and the bottom force are then utilized to apply a magnetic field having an intensity distribution to the molding material layer formed in the thickness-wise direction thereof, thereby gathering the conductive particles between the ferromagnetic substance portions in the top force and the ferromagnetic substance portions in the bottom force located right below the portions of the top force by an effect of magnetic force, and further orienting the conductive particles so as to align in the thickness-wise direction. In that state, the molding material layer is subjected to a curing treatment, thereby producing anisotropically conductive sheet having the construction that a plurality of columnar conductive path-forming parts are mutually insulated by an insulating part.

The first inspection apparatus 10 is not limited to the construction that the anisotropically conductive sheets are separately produced, and the sheets produced are arranged on other component members, for example, the circuit boards for inspection, and may be such that these sheets are integrated with other component members in the production process thereof.

In the first inspection apparatus 10 of the construction described above, electrical inspection of the circuit board 1 to be inspected is performed in the following manner.

The circuit board 1 to be inspected is arranged in the inspection-executing region 11 by the circuit board-holding mechanism. In this state, the upper-side support-infixing plate 23 and the lower-side support-infixing plate 27 are respectively moved in directions approaching to the circuit board 1 to be inspected, whereby the upper-side supports 22 and lower-side support 26 press the upper-side base plate 21 and the lower-side base plate 25, respectively, thereby moving the upper-side board-compressing member 30 and the lower-side board-compressing member 50 in directions approaching to the circuit board 1 to be inspected. As a result, the circuit board 1 to be inspected is compressed by the upper-side board-compressing member 30 and the lower-side board-compressing member 50.

Figure 12:
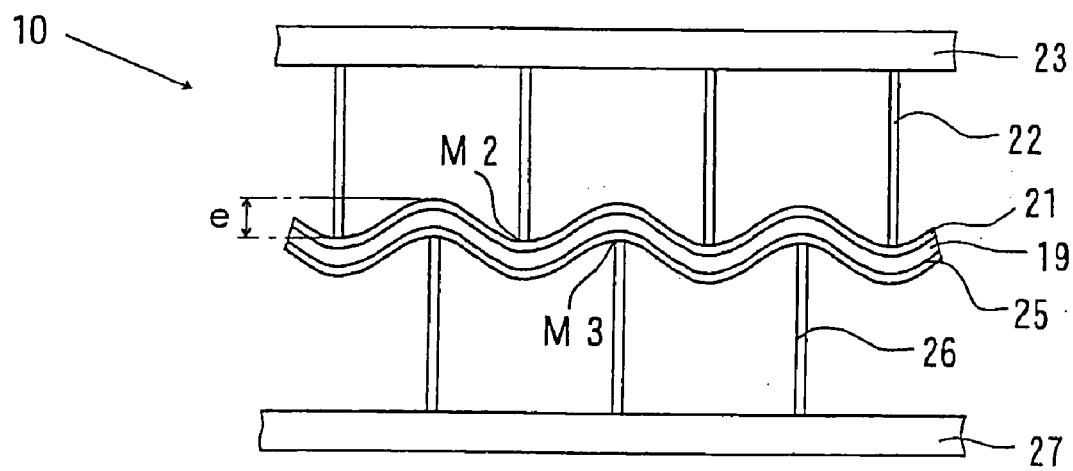
FIG. 12 illustrates a measurable state of the inspection apparatus for circuit board shown in FIG. 1.

As illustrated in FIG. 12, a complex stack 19 composed of the circuit board 1 to be inspected, and the upper-side board-compressing member 30 and lower-side board-compressing member 50 which compress the circuit board, is deflected by being shifted in the thickness-wise direction together with the upper-side base plate 21 and lower-side base plate 25, at positions, over the whole body, respectively pressed by the upper-side supports 22 and lower-side supports 26 in accordance with the upper-side supporting points 21A and lower-side supporting points 25B, and deformed in the form of a regular wave shape to bring about a measurable state.

Even in the measurable state, the alignment movable plate 15 is in a state slidable with the movement of the alignment support 16 as in a non-measurable state.

The first inspection apparatus 10 is so constructed that in such a measurable state, a gap (hereinafter also referred to as "gap between upper-side and low-side supports") in the thickness-wise direction of the complex stack 19 between a tip level (hereinafter also referred to as "upper-side level") in the upper-side support 22 and a tip level (hereinafter also referred to as "lower-side level") in the lower-side support 26 is smaller than the total thickness of the complex stack 19, the upper-side base plate 21 and the lower-side base plate 25.

In the above, "the thickness of the complex stack 19" means the total thickness of the upper-side board-compressing member 30, the circuit board 1 to be inspected and the lower-side board-compressing member 50.

In the above, "the gap between upper-side and lower-side supports" means a clearance between a boundary surface (hereinafter also referred to as "upper-side boundary surface") M2 between the upper-side support 22 and the upper-side base plate 21 located on the upper-side level and a boundary surface (hereinafter also referred to as "lower-side boundary surface") M3 between the lower-side support 26 and the lower-side base plate 25 located on the lower-side level in a direction perpendicular to the thickness-wise direction of the complex stack 19 when the upper-side boundary surface M2 is located above the lower-side boundary surface M3 in FIG. 12. Accordingly, in this description, the case where the positional relation between the upper-side boundary surface M2 and the lower-side boundary surface M3 is reversed is regarded as a state that there is no gap between upper-side and lower-side supports.

If the gap between upper-side and lower-side supports is too great, the complex stack 19 cannot be deformed together with the upper-side base plate 21 and lower-side base plate 25 in the measurable state in accordance with the upper-side supporting points 21A and lower-side supporting points 25B.

The shifted state of the complex stack 19 in the measurable state is described specifically taking the shifted state in the upper-side unit region R1 as an example. A ratio of the degree of deflection e (see FIG. 12) in the upper-side unit region R1 to the clearance c (see FIG. 4) between 2 upper-side supporting points 21A located on a diagonal line making up the upper-side unit region R1 is preferably 1 down to 0.02%, more preferably 0.5 down to 0.04%.

The pressing force against the circuit board 1 to be inspected in the measurable state is set to, for example, 110 to 250 kgf.

In this measurable state, all the upper-side electrodes 2 to be inspected on the circuit board 1 to be inspected are, respectively, electrically connected to their corresponding pairs of inspection electrodes each composed of the electrode 32A for current supply and the electrode 32B for voltage measurement in the upper-side adaptor 31 through the anisotropically conductive sheet 33, and the terminal electrodes 32C of this upper-side adaptor 31 are, respectively, electrically connected to their corresponding inspection pins 36 of the upper-side inspection head 35 through the conductive path-forming parts 37A of the anisotropically conductive sheet 37.

On the other hand, all the lower-side electrodes 3 to be inspected on the circuit board 1 to be inspected are, respectively, electrically connected to their corresponding pairs of inspection electrodes each composed of the electrode 52A for current supply and the electrode 52B for voltage measurement in the lower-side adaptor 51 through the anisotropically conductive sheet 53, and the terminal electrodes 52C of this lower-side adaptor 51 are electrically connected to their corresponding inspection pins 56 of the lower-side inspection head 55 through the conductive path-forming parts of the anisotropically conductive sheet 57.

A current is supplied between the electrodes for current supply from the tester, and a voltage signal between the electrodes for voltage measurement is detected and processed by the tester, whereby electric resistance in the upper-side electrodes 2 to be inspected and lower-side electrodes 3 to be inspected can be measured.

According to the above-described first inspection apparatus 10, in the measurable state, points of application of the pressing force by the upper-side supports 22 and points of application of the pressing force by the lower-side supports 26 are formed in the form of a lattice at positions different from one another on the specific plane Ml of projection, and the complex stack 19, in which the circuit board 1 to be inspected is compressed, is, as it were, forcedly deformed together with the upper-side base plate 21 and lower-side base plate 25 in accordance with the upper-side supporting points 21A and lower-side supporting points 25B forming the points of application so as to form a regular wave shape, thereby inhibiting the pressing force from concentrating on the points of application. As a result, since the pressure distribution in the circuit board 1 to be inspected is uniformed, a state that all the electrodes (upper-side electrodes 2 to be inspected and lower-side electrodes 3 to be inspected) to be inspected in the circuit board 1 to be inspected have been evenly electrically connected to their corresponding electrodes for current supply and electrodes for voltage measurement can be attained, so that the electric resistance of the circuit board can be measured with high accuracy.

Since both upper-side base plate 21 and lower-side base plate 25 are preferably made thinner for the purpose of achieving such a state, the weight of the whole first inspection apparatus 10 is made light by the reduction of mass of each of the upper-side base plate 21 and lower-side base plate 25. The mass of each of the upper-side base plate 21 and lower-side base plate 25 is actually reduced to at most half of the mass of base plates constructing the conventional inspection apparatus for circuit board.

Accordingly, according to the first inspection apparatus 10, the thickness of the anisotropically conductive sheets can be made thin without involving defectiveness, so that the electrical inspection of a circuit board can be conducted with high reliability even when the circuit board has inspection object electrodes small in size and pitch or clearance, and moreover the weight saving of the apparatus itself can be planed.

Since the pressure distribution in the circuit board 1 to be inspected is uniformed, those having the construction that conductive particles are contained in the whole region of a base material composed of an elastic polymeric substance having insulating property in a state evenly oriented can be suitably used as the anisotropically conductive sheets 33, 35 making up each of the upper-side adaptor 31 and lower-side adaptor 51.

Further, since the measurable state is created by deforming the complex stack 19 together with the upper-side base plate 21 and lower-side base plate 25, it is not necessary to use those, the respective overall lengths of which have been equalized with high precision, as the plurality of the upper-side supports 22 and lower-side supports 26 for forming the upper-side supporting points 21A and lower-side supporting points 25B, which are points of application, on each of the upper-side base plate 21 and lower-side base plate 25 so far as the inspection apparatus has the construction that this measurable state can be attained. As a result, the first inspection apparatus 10 can be easily produced.

Since the conduction between each of the inspection object electrodes (upper-side electrodes 2 to be inspected and upper-side electrodes 3 to be inspected) in the circuit board 1 to be inspected and pair of inspection electrodes can be achieved by small pressing force to bring about the measurable state, durable strength in pressurization required of the component members can be made low. As a result, members relatively low in durable strength in pressurization can be used as the component members of the first inspection apparatus 10, whereby the miniaturization and simplification of the inspection apparatus itself can be expected, and production cost can be reduced.

Since the electrical inspection of the circuit board 1 to be inspected can be conducted by small pressing force, the deterioration of the anisotropically conductive sheets 33, 37, 53 and 57 caused by repetitive pressurization in every inspection can be inhibited. Accordingly, the frequency of replacement of the anisotropically conductive sheets 33, 37, 53 and 57 in the first inspection apparatus 10 can be lessened, so that high inspection efficiency can be achieved, and inspection cost can be reduced.

Further, thin plates are used as the upper-side base plate 21 and lower-side base plate 25, whereby each of the through-holes (specifically, through-holes 21B and 25D for inspection pins, and through-holes 25C for positioning pin) required upon construction can be formed by one drilling operation. Accordingly, the time required for the drilling operation can be shortened, and the rate of success in drilling operation becomes high compared with an inspection apparatus equipped with thick base plates that require plural times of drilling operation for forming a through-hole, so that the through-holes can be formed with high efficiency to attain high productivity.

Figure 13:
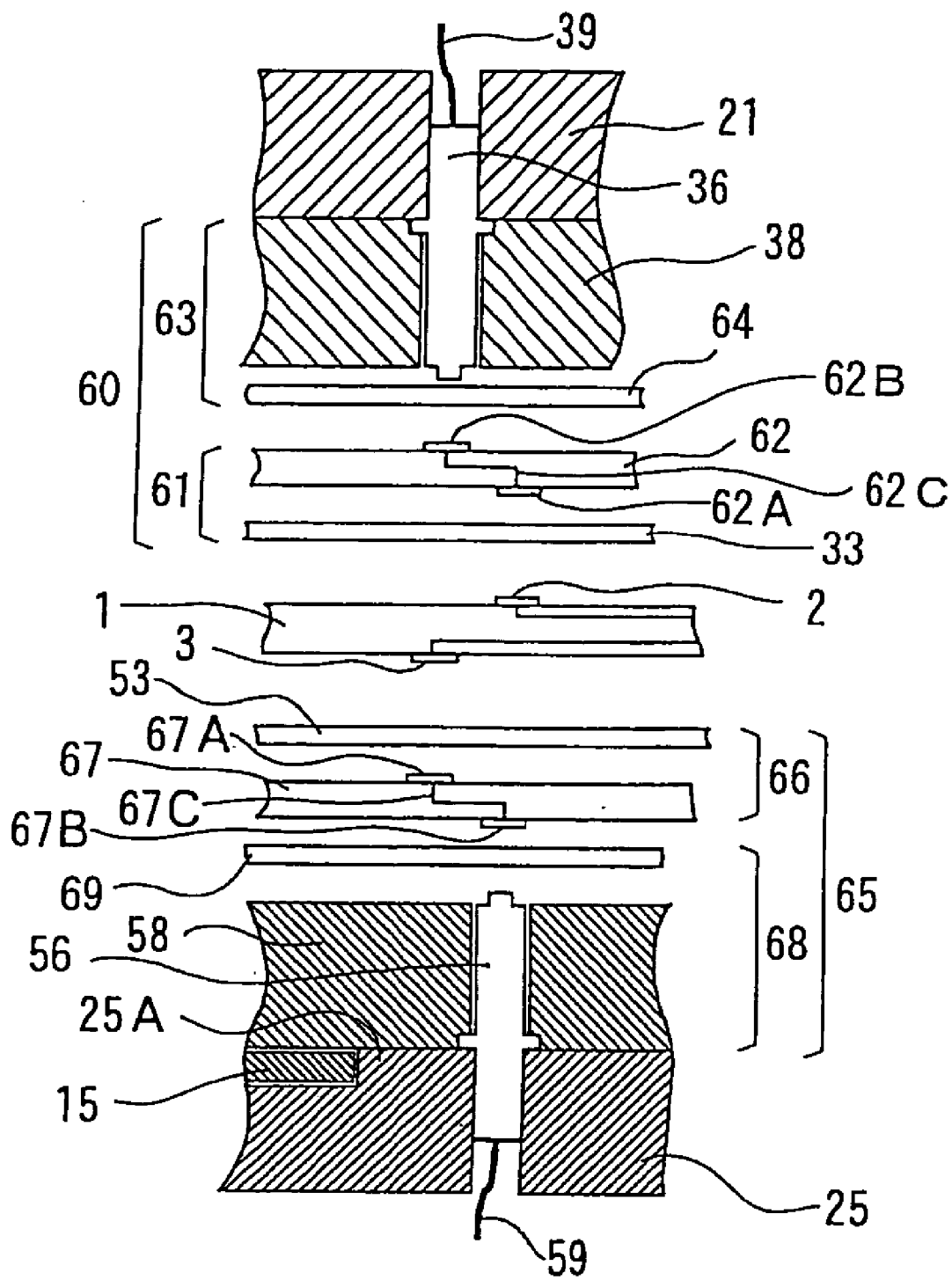
FIG. 13 is a cross-sectional view illustrating, on an enlarged scale, a part of the construction of another exemplary inspection apparatus for circuit board according to the present invention.

FIG. 13 is a cross-sectional view illustrating, on an enlarged scale, a part of the construction of another exemplary inspection apparatus for circuit board according to the present invention.

This inspection apparatus (hereinafter also referred to as "second inspection apparatus") is used for conducting electrical inspection of a circuit board, on both surfaces of which inspection object electrodes (electrodes to be inspected) have been formed. In this inspection apparatus, an upper-side board-compressing member 60 arranged on an upper side of an inspection object circuit board (circuit board to be inspected) 1 and having a plurality of inspection electrodes 62A formed in accordance with a pattern corresponding to upper-side electrodes 2 to be inspected of the circuit board 1 to be inspected and provided with an anisotropically conductive sheet 33 on its front surface (lower surface in FIG. 13) and, a lower-side board-compressing member 65 arranged on a lower side of the circuit board 1 to be inspected and having a plurality of inspection electrodes 67A formed in accordance with a pattern corresponding to lower-side electrodes 3 to be inspected of the circuit board 1 to be inspected and provided with an anisotropically conductive sheet 53 on its front surface (upper surface in FIG. 13) are arranged so as to be vertically opposed to each other.

The second inspection apparatus has the same construction as the first inspection apparatus 10 except that the construction of the upper-side board-compressing member and lower-side board-compressing member is different, and as the first inspection apparatus 10, the second inspection apparatus takes circuit boards having flexibility as the object of inspection. In FIG. 13, the same reference numerals as in the first inspection apparatus are given to component members having the same construction as in the first inspection apparatus.

In this embodiment, the second inspection apparatus takes circuit boards having the same construction as the inspection object circuit board related to the first inspection apparatus, as the object of inspection.

Even in the second inspection apparatus, as with the first inspection apparatus 10, an upper-side supporting points formed on an upper-side base plate 21, on which the upper-side board-compressing member 60 is provided, and a lower-side supporting point formed on a lower-side base plate 25, on which the lower-side board-compressing member 65 is provided, are arranged at positions different from each other on a plane (specific plane of projection) of projection in a thickness-wise direction of the upper-side board-compressing member 60 and lower-side board-compressing member 65 when the second inspection apparatus is seen through from above (from above in FIG. 13).

Specifically, the upper-side supporting points and the lower-side supporting points are formed in the form of a lattice on the upper-side base plate 21 and on the lower-side base plate 25, respectively.

When the supporting points are formed in the form of a lattice in such a manner, a clearance between upper-side supporting points adjacent to each other and a clearance between lower-side supporting points adjacent to each other are each preferably 10 to 100 mm, more preferably 12 to 70 mm, particularly preferably 15 to 50 mm.

In the second inspection apparatus, the upper-side board-compressing member 60 is constructed by arranging an upper-side adaptor 61 composed of a circuit board 62 for inspection and an anisotropically conductive sheet 33, and an upper-side inspection head 63 composed of inspection pins 36 fixed by the upper-side base plate 21 and a spacer board 38 and an anisotropically conductive sheet 64 in this order from below in FIG. 13.

The circuit board 62 for inspection making up the upper-side adaptor 61 in the upper-side board-compressing member 60 has the construction that the inspection electrodes 62A formed in accordance with a pattern corresponding to the upper-side electrodes 2 to be inspected of the circuit board 1 to be inspected are provided on its front surface, and a plurality of terminal electrodes 62B are arranged on its back surface (upper surface in FIG. 13) according to positions of lattice points having a pitch of, for example, 0.2 mm, 0.3 mm, 0.45 mm, 0.5 mm, 0.75 mm, 0.8 mm, 1.06 mm, 1.27 mm, 1.5 mm, 1.8 mm or 2.54 mm.

Each of the terminal electrodes 62B in the circuit board 62 for inspection is electrically connected to its corresponding inspection electrode 62A through an internal wiring part 62C.

The anisotropically conductive sheet 64 making up the upper-side inspection head 64 in the upper-side board-compressing member 60 is the so-called dispersion type anisotropically conductive sheet that conductive particles are contained in a base material composed of an elastic polymeric substance having insulating property in a state oriented so as to align in a thickness-wise direction of the anisotropically conductive sheet 64, and has the construction that conductive paths are formed by chains of the conductive particles when the sheet is pressurized in the thickness-wise direction in the measurable state. This anisotropically conductive sheet 64 is fixed by a proper means.

The anisotropically conductive sheet 64 preferably has a thickness of 0.1 to 1.5 mm and can be obtained by using the above-described sheet-forming material in accordance with the above-described production process.

The upper-side board-compressing member 60 of the above-described construction can be produced by arranging the spacer board 38, in which a plurality of through-holes for inspection pin have been formed, the anisotropically conductive sheet 64, the circuit board 62 for inspection and the anisotropically conductive sheet 33 at prescribed positions in this order on the front surface of the upper-side base plate 21 in which the inspection pins 36 have been infixed.

In the second inspection apparatus, the lower-side board-compressing member 65 is constructed by arranging a lower-side adaptor 66 composed of a circuit board 67 for inspection and an anisotropically conductive sheet 53, and a lower-side inspection head 68 composed of inspection pins 56 fixed by the lower-side base plate 25 and a spacer board 58 and an anisotropically conductive sheet 69 in this order from above in FIG. 13.

The circuit board 67 for inspection making up the lower-side adaptor 66 in the lower-side board-compressing member 65 has the construction that the inspection electrodes 67A formed in accordance with a pattern corresponding to the lower-side electrodes 3 to be inspected of the circuit board 1 to be inspected are provided on its front surface, and a plurality of terminal electrodes 67B are arranged on its back surface (lower surface in FIG. 13) according to positions of lattice points having a pitch of, for example, 0.2 mm, 0.3 mm, 0.45 mm, 0.5 mm, 0.75 mm, 0.8 mm, 1.06 mm, 1.27 mm, 1.5 mm, 1.8 mm or 2.54 mm.

Each of the terminal electrodes 67B in the circuit board 67 for inspection is electrically connected to inspection electrode 67A through an internal wiring part 67C.

The anisotropically conductive sheet 69 making up the lower-side inspection head 68 in the lower-side board-compressing member 65 is the so-called dispersion type anisotropically conductive sheet that conductive particles are contained in a base material composed of an elastic polymeric substance having insulating property in a state oriented so as to align in a thickness-wise direction of the anisotropically conductive sheet 69, and has the construction that conductive paths are formed by chains of the conductive particles when the sheet is pressurized in the thickness-wise direction in the measurable state. This anisotropically conductive sheet 69 is fixed by a proper means.

The anisotropically conductive sheet 69 preferably has a thickness of 0.1 to 1.5 mm and can be obtained by using the above-described sheet-forming material in accordance with the above-described production process.

The lower-side board-compressing member 65 of the above-described construction can be produced by arranging an alignment movable plate 15, in which a substantially rectangular hole 15A has been formed, the spacer board 58, in which a plurality of through-holes for inspection pin have been formed, the anisotropically conductive sheet 69, the circuit board 67 for inspection and the anisotropically conductive sheet 53 at prescribed positions in this order on the front surface of the lower-side base plate 25 in which the inspection pins 56 have been infixed at its projected part 25A.

In the second inspection apparatus of the above-described construction, as the first inspection apparatus 10, the circuit board 1 to be inspected is compressed by the upper-side board-compressing member 60 and lower-side board-compressing member 65, a complex stack composed of the circuit board 1 to be inspected, and the upper-side board-compressing member 60 and lower-side board-compressing member 65 compressing the circuit board, is deflected by shifting in the thickness-wise direction together with the upper-side base plate 21 and lower-side base plate 25, at positions where the stack is respectively pressed by the upper-side supports and lower-side supports in accordance with the upper-side supporting points and lower-side supporting points, and deformed in the form of a regular wave to bring about a measurable state.

In such a measurable state, a gap between upper-side and low-side supports in the thickness-wise direction of the complex stack between an upper-side level of the upper-side support and a lower-side level of the lower-side support becomes smaller than the total thickness of the complex stack, the upper-side base plate 21 and the lower-side base plate 25.

As an example of the shifted state of the complex stack in the measurable state of this second inspection apparatus, a ratio of the degree b of deflection in the upper-side unit region to the clearance between 2 upper-side supporting points located on a diagonal line making up the upper-side unit region is preferably 1 down to 0.02%, more preferably 0.5 down to 0.04% in the same manner as the example of the shifted state related to the first inspection apparatus 10.

The pressing force against the circuit board 1 to be inspected in the measurable state is set to, for example, 110 to 250 kgf.

In this measurable state, all the upper-side electrodes 2 to be inspected on the circuit board 1 to be inspected, respectively, are electrically connected to their corresponding inspection electrodes 62A of the upper-side adaptor 61 through the anisotropically conductive sheet 33, and the terminal electrodes 62B of this upper-side adaptor 61 are, respectively, electrically connected to their corresponding inspection pins 36 of the upper-side inspection head 63 through the anisotropically conductive sheet 64. On the other hand, all the lower-side electrodes 3 to be inspected on the circuit board 1 to be inspected are, respectively, electrically connected to their corresponding inspection electrodes 67A of the lower-side adaptor 66 through the anisotropically conductive sheet 53, and the terminal electrodes 67B of this lower-side adaptor 66 are, respectively, electrically connected to their corresponding inspection pins 56 of the lower-side inspection head 68 through the anisotropically conductive sheet 69.

In such a manner, the upper-side electrodes 2 to be inspected and lower-side electrodes 3 to be inspected of the circuit board 1 to be inspected are electrically connected to their corresponding inspection pins 36 in the upper-side inspection head 63 and their corresponding inspection pins 56 in the lower-side inspection head 68, respectively, whereby a state that they have been electrically connected to an inspection circuit of a tester is achieved and necessary electrical inspection is conducted in this state.

According to the above-described second inspection apparatus, in the measurable state, points of application of the pressing force by the upper-side supports and points of application of the pressing force by the lower-side supports are formed in the form of a lattice at positions different from one another on the specific plane of projection, and the complex stack, in which the circuit board 1 to be inspected is compressed, is, as it were, forcedly deformed together with the upper-side base plate 21 and lower-side base plate 25 in accordance with the upper-side supporting points and lower-side supporting points forming the points of application so as to form a regular wave shape, thereby inhibiting the pressing force from concentrating on the points of application. As a result, since the pressure distribution in the circuit board 1 to be inspected is uniformed, a state that all the electrodes (upper-side electrodes 2 to be inspected and lower-side electrodes 3 to be inspected) to be inspected in the circuit board 1 to be inspected have been evenly electrically connected to their corresponding inspection electrodes 62A and 67A can be attained, so that the electrical inspection of the circuit board can be performed with high reliability.

Since both upper-side base plate 21 and lower-side base plate 25 are preferably made thinner for the purpose of achieving such a state, the weight of the whole second inspection apparatus is made light by the reduction of mass of each of the upper-side base plate 21 and lower-side base plate 25. The mass of each of the upper-side base plate 21 and lower-side base plate 25 is actually reduced to at most half of the mass of base plates constructing the conventional inspection apparatus for circuit board.

Accordingly, according to the second inspection apparatus for circuit board, the thickness of the anisotropically conductive sheets can be made thin without involving defectiveness in such a manner as in the first inspection apparatus 10, so that the electrical inspection of a circuit board can be conducted with high reliability even when the circuit board has inspection object electrodes small in size and pitch or clearance, and moreover the weight saving of the apparatus itself can be expected.

Since the pressure distribution in the circuit board 1 to be inspected is uniformed, anisotropically conductive sheets having the construction that conductive particles are contained in the whole region of a base material composed of an elastic polymeric substance having insulating property in a state evenly oriented can be suitably used as the anisotropically conductive sheets.

Further, since the measurable state is created by deforming the complex stack together with the upper-side base plate 21 and lower-side base plate 25, it is not necessary to use those, the respective overall lengths of which have been equalized with high precision, as the plurality of the upper-side supports and lower-side supports for forming the upper-side supporting points and lower-side supporting points, which are points of application, on each of the upper-side base plate 21 and lower-side base plate 25 so far as the inspection apparatus has the construction that this measurable state can be attained. As a result, the second inspection apparatus can be easily produced.

Since the conduction between each of the inspection object electrodes (upper-side electrodes 2 to be inspected and upper-side electrodes 3 to be inspected) in the circuit board 1 to be inspected and inspection electrodes 62A, 67A can be achieved by small pressing force to bring about the measurable state, durable strength in pressurization required of the component members can be made low. As a result, members relatively low in durable strength in pressurization can be used as the component members of the second inspection apparatus, whereby the miniaturization and simplification of the inspection apparatus itself can be expected, and production cost can be reduced.

Since the electrical inspection of the circuit board 1 to be inspected can be conducted by small pressing force, the deterioration of the anisotropically conductive sheets 33, 64, 53 and 69 caused by repetitive pressurization in every inspection can be inhibited. Accordingly, the frequency of replacement of the anisotropically conductive sheets 33, 64, 53 and 69 in the second inspection apparatus can be lessened, so that high inspection efficiency can be achieved, and inspection cost can be reduced.

Further, thin plates are used as the upper-side base plate 21 and lower-side base plate 25, whereby each of the through-holes required for the construction can be formed by one drilling operation. Accordingly, the time required upon drilling operation can be shortened, and the rate of success in drilling operation becomes high compared with an inspection apparatus equipped with thick base plates that require plural times of drilling operation for forming a through-hole, so that the through-holes can be formed with high efficiency to attain high productivity.

Although the present invention has been described specifically above, the present invention is not limited to the above-described embodiments, and various modifications can be added thereto.

Figure 14:
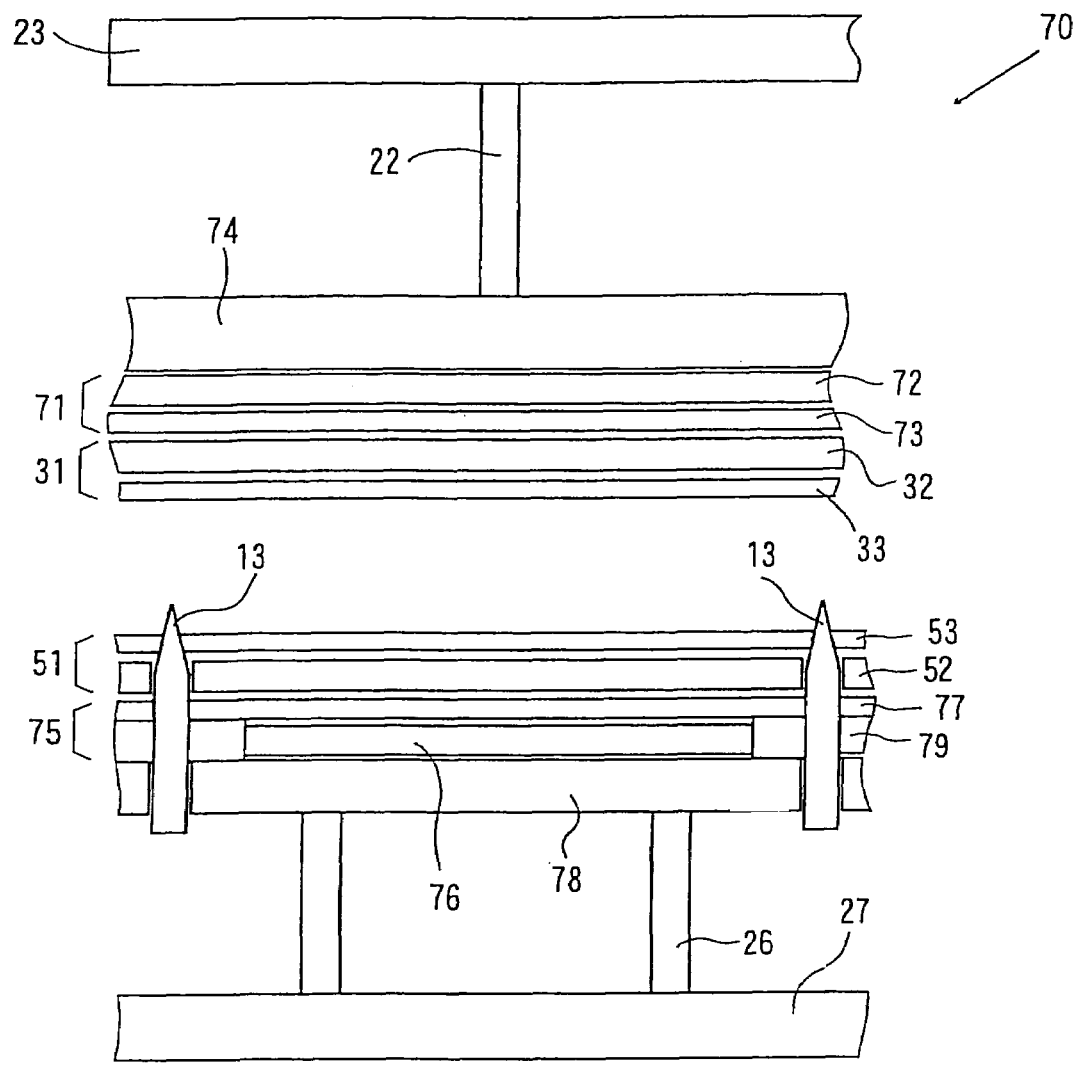
FIG. 14 is a cross-sectional view illustrating the construction of a further exemplary inspection apparatus for circuit board according to the present invention.
Figure 15:
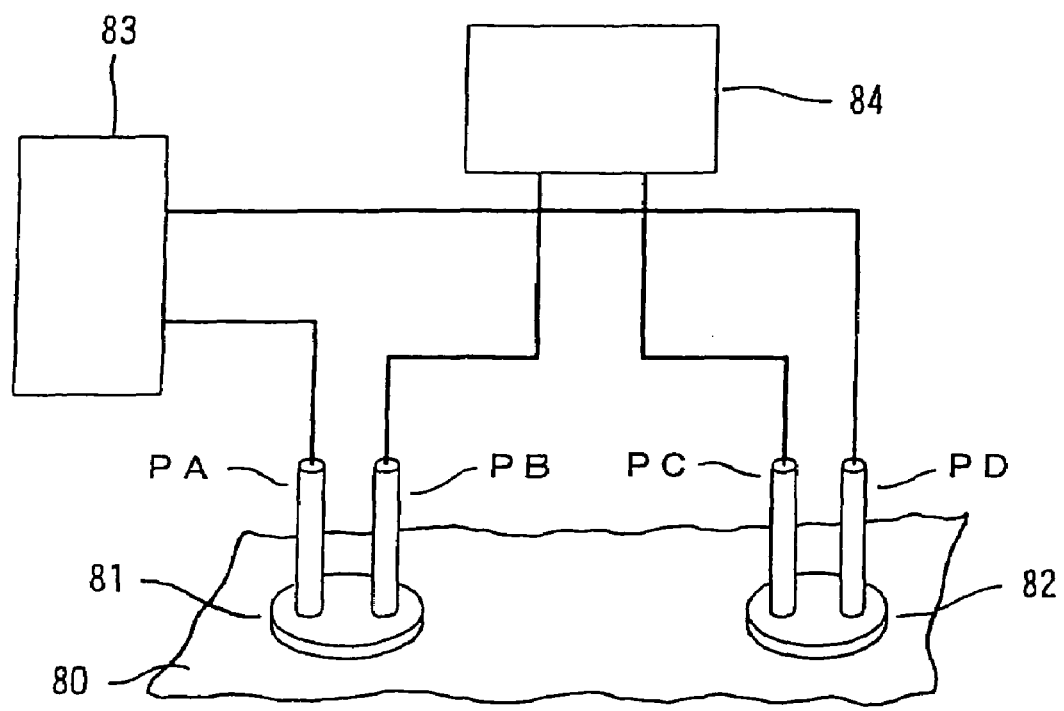
FIG. 15 typically illustrates an apparatus for measuring electric resistance between electrodes in a circuit board by probes for current supply and probes for voltage measurement.
Figure 16:
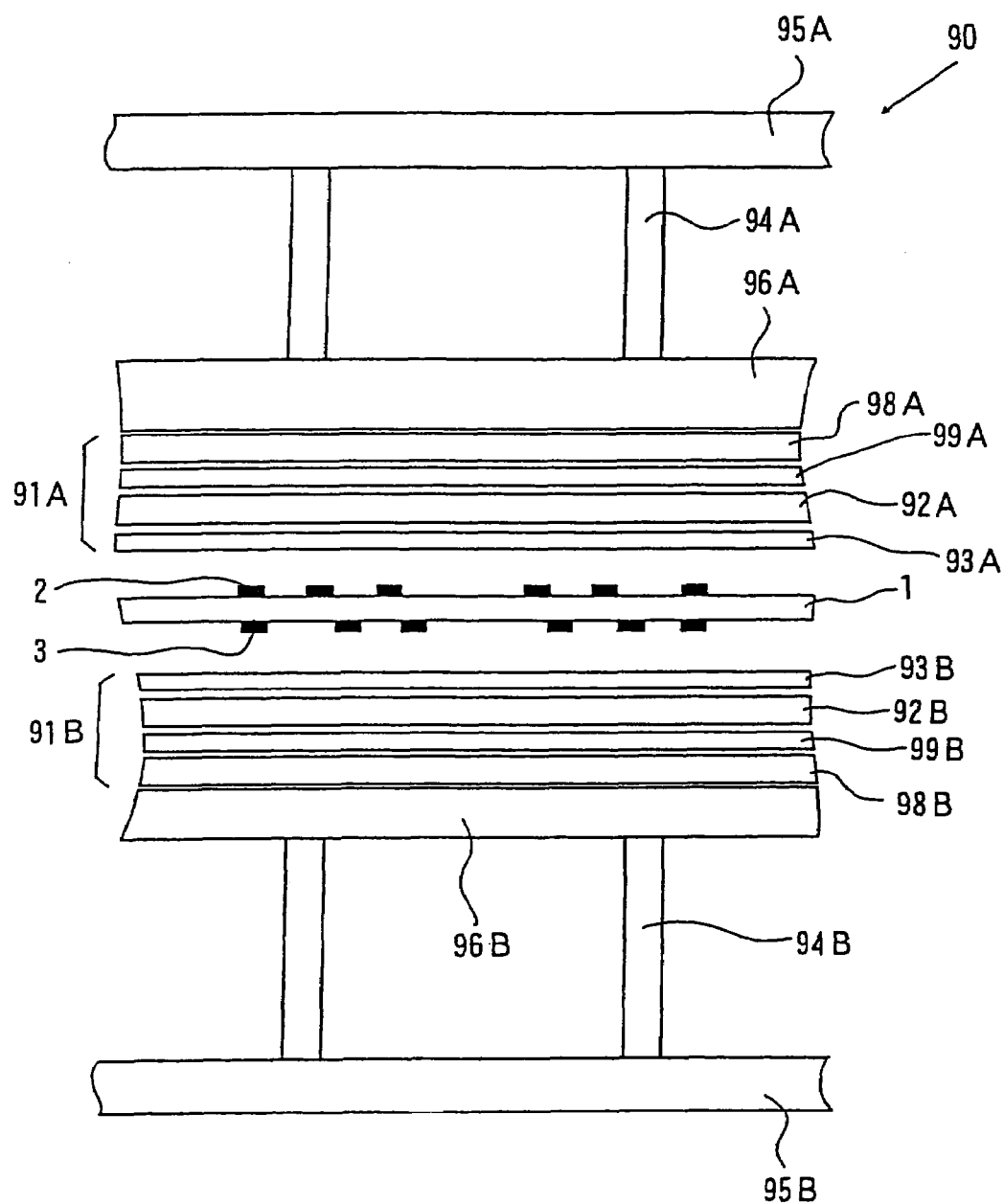
FIG. 16 illustrates the construction of an exemplary conventional inspection apparatus for circuit board together with an inspection object circuit board.

For example, the inspection apparatus for circuit board may be such that an upper-side inspection head 71 and a lower-side inspection head 75, which are provided on plate-like upper-side base plate 74 and lower-side base plate 78, respectively, are respectively constructed by plate-like electrode devices 72 and 76 and anisotropically conductive sheets 73 and 77 fixed and arranged on respective front surfaces (surfaces positioned on the side of the circuit board 1 to be inspected in FIG. 14) of the electrode devices 72, 76 as illustrated in FIG. 14. Each of the electrode devices 72 and 76 has a plurality of connecting electrodes (not illustrated) arranged at positions of lattice points having the same pitch as the terminal electrodes (not illustrated) of the upper-side adaptor 31 and the lower-side adaptor 51 on its front surface. Each of these connecting electrodes is electrically connected to connectors (not illustrated) respectively provided on the upper-side support-infixing plate 23 and the lower-side support-infixing plate 27 by a wire (not illustrated) through an electrode pin (not illustrated) and further electrically connected to a tester (not illustrated) through the connectors. In FIG. 14, reference numeral 79 designates a spacer for fixing the positioning pin 13 making up the circuit board-holding mechanism, and the same reference numerals as in the first inspection apparatus 10 illustrated in FIG. 1 are given to component members having the same construction as those in the first inspection apparatus among component elements in the inspection apparatus 70.

The inspection apparatus for circuit board is not limited to those having the construction that the upper-side supporting points and lower-side supporting points are respectively formed so as to be regularly arranged on corresponding base plates and may be those having the construction that the upper-side supports and lower-side supports forming the supporting points are arranged in an irregular state according to arranged states of other component members such as wires.

In the inspection apparatus for circuit board, those of the dispersion type or uneven distribution type may be suitably used as the anisotropically conductive sheets making up the inspection apparatus. Further, those having an irregular surface with conductive path-forming parts projected on one side or both sides thereof or those having no irregularities may be suitably used as the uneven distribution type anisotropically conductive sheet.

EXAMPLES

The present invention will hereinafter be described specifically by the following Examples. However, the present invention is not limited to these Examples.

Example 1

An inspection apparatus (hereinafter also referred to as "Inspection Apparatus (1)") for circuit board of the following conditions, which is adapted to an inspection section of a rail-carried type automatic circuit board inspection machine "STARREC V5" (manufactured by NIDEC-READ CORPORATION) was produced in accordance with the construction shown in FIG. 1.

Upon the production of this Inspection Apparatus (1), that having a thickness of 4.0 mm was used as an upper-side base plate, so that one through-hole was capable of being formed by one drilling operation, the drilling operation time required to form one through-hole was able to be shortened compared with a lower-side base plate that has a thickness of 6.0 mm and requires plural times of drilling operation for forming one through-hole, and the through-holes were capable of being formed with high efficiency.

In Inspection Apparatus (1), as illustrated in FIG. 4, upper-side supporting points and lower-side supporting points are respectively formed in the form of a lattice and arranged in such a manner that on the specific plane M1 of projection, one lower-side supporting point 25B is arranged at a position where 2 diagonal lines intersect with each other within a rectangular upper-side unit region R1 partitioned by adjacent 4 upper-side supporting points 21A, and one upper-side supporting point 21A is arranged at a position where 2 diagonal lines intersect with each other within a rectangular lower-side unit region R2 partitioned by adjacent 4 lower-side supporting points 25B.

(1) Upper-Side Adaptor:

[Circuit Board for Inspection]
   Dimensions of electrodes for current supply:
   0.06 mm by 0.15 mm
   Dimensions of electrodes for voltage measurement:
   0.06 mm by 0.15 mm
   Clearance between electrode for current supply and electrode for voltage measurement: 90 µm
   Dimensions of terminal electrodes: 0.4 mm in diameter
   Material of base material:
   glass fiber-reinforced epoxy resin
   Maximum thickness: 1.0 mm

[Anisotropically Conductive Sheet]
   Dimensions: 110 mm by 110 mm by 0.1 mm in thickness
   Conductive particles:
   material: nickel particles plated with gold,
   average particle diameter: 20 µm,
   content: 18% by volume
   Elastic polymeric substance:
   Material: silicone rubber,
   hardness: 40
   Electric resistance in thickness-wise direction in measurable state: 0.1 Ω
   Ratio of electric resistance value in thickness-wise direction to electric resistance value in plane direction: 1,000 or higher (2) Upper-side Inspection Head:

[Inspection Pin]
   Material: brass plated with gold
   Dimensions of tip part:
   0.35 mm in outer diameter, 0.1 mm in overall-length
   Dimensions of central part:
   0.48 mm in outer diameter, 1.8 mm in overall length
   Dimensions of large-diameter part:
   0.55 mm in outer diameter, 0.1 mm in overall length
   Dimensions of proximal part:
   0.48 mm in outer diameter, 3.0 mm in overall length
   Clearance between adjacent inspection pins: 0.75 mm

[Anisotropically Conductive Sheet]
   Dimensions: 110 mm by 110 mm
   Thickness of conductive path-forming parts: 0.6 mm
   Outer diameter of conductive path-forming parts: 0.25 mm
   Projected height of conductive path-forming parts: 0.05 mm
   Conductive particles:
   material: nickel particles plated with gold, average particle diameter: 35 µm,
   content: 13% by volume
   Elastic polymeric substance:
   material: silicone rubber,
   hardness: 30

[Spacer Board]
   Material: glass fiber-reinforced epoxy resin material "FR-4"
   Dimensions: 200 mm by 346 mm by 1.9 mm in thickness (3) Upper-side Base Plate:
   Material: glass fiber-reinforced epoxy resin material "FR-4"
   Dimensions: 200 mm by 346 mm by 4.0 mm in thickness
   Mass: 0.5 kg (4) Upper-side Support:
   Material: brass
   Dimensions:
   outer diameter of tip part: 4 mm,
   overall length: 67 mm
   Clearance between adjacent upper-side supports:
   Lateral direction in FIG. 1 (hereinafter also referred to as "lateral direction" merely): 32.25 mm,
   Direction (hereinafter also referred to as "vertical direction" merely) perpendicular to lateral direction: 24.75 mm (5) Lower-side Adaptor

[Circuit Board for Inspection]
   Dimensions of electrodes for current supply:
   0.06 mm by 0.15 mm
   Dimensions of electrodes for voltage measurement:
   0.06 mm by 0.15 mm
   Clearance between electrode for current supply and electrode for voltage measurement: 90 µm Dimensions of terminal electrodes: 0.4 mm in diameter
Material of base material:
glass fiber-reinforced epoxy resin
Maximum thickness: 1.0 mm

[Anisotropically Conductive Sheet]
Dimensions: 100 mm by 110 mm by 0.1 mm in thickness
Conductive particles:
material: nickel particles plated with gold,
average particle diameter: 20 μm,
content: 18% by volume
Elastic polymeric substance:
material: silicone rubber,
hardness: 40
Electric resistance in thickness-wise direction in measurable state: 0.1 Ω
Ratio of electric resistance value in thickness-wise direction to electric resistance value in plane direction: 1,000 or higher (6) Lower-side Inspection Head:

[Inspection Pin]
Material: brass plated with gold
Dimensions of tip part:
0.35 mm in outer diameter, 0.1 mm in overall length
Dimensions of large-diameter part:
0.55 mm in outer diameter, 1.8 mm in overall length
Dimensions of proximal part:
0.48 mm in outer diameter, 3.0 mm in overall length
Clearance between adjacent inspection pins: 0.75 mm

[Anisotropically Conductive Sheet]
Dimensions: 100 mm by 110 mm
Thickness of conductive path-forming parts: 0.6 mm
Outer diameter of conductive path-forming parts: 0.25 mm
Projected height of conductive path-forming parts: 0.05 mm
Conductive particles:
material: nickel particles plated with gold,
average particle diameter: 35 μm,
content: 13% by volume
Elastic polymeric substance:
material: silicone rubber,
hardness: 30

[Spacer Board]
Material: glass fiber-reinforced epoxy resin material "FR-4"
Dimensions: 100 mm by 338 mm by 1.9 mm in thickness

[Alignment movable plate]
Dimensions: 100 mm by 338 mm by 2.95 mm in thickness (7) Lower-side Base Plate:
Material: glass fiber-reinforced epoxy resin material "FR-4"
Dimensions: 100 mm by 338 mm by 6.0 mm in thickness
Projected height of projected part: 3.0 mm
Mass: 0.4 kg (8) Lower-side Support:
Material: brass
Dimensions:
outer diameter of tip part: 4 mm,
overall length: 65 mm
Clearance between adjacent lower-side supports:
Lateral direction: 32.25 mm,
Vertical direction: 24.75 mm (9) Upper-side Supporting Points and Lower-side Supporting Points:
Clearance between adjacent upper-side supporting points:
Lateral direction: 32.25 mm,
Vertical direction: 24.75 mm
Length (clearance c in FIG. 4) of diagonal line in upper-side unit region: about 41 mm
Clearance between adjacent lower-side supporting points:
Lateral direction: 32.25 mm,
Vertical direction: 24.75 mm
Length of diagonal line in lower-side unit region:
about 41 mm
Clearance (d in FIG. 4) between lower-side supporting point and upper-side supporting point located within upper-side unit region: about 20 mm In Inspection Apparatus (1), a non-defective circuit board having the following specification was used as a circuit board to be inspected to conduct performance tests (measurement of minimum pressing pressure and determination of durability of anisotropically conductive sheets) in accordance with the following respective methods. The measured results of the minimum pressing pressure are shown in Table 1, and the determined results of the durability of anisotropically conductive sheets are shown in Table 2.

In the performance tests, it was confirmed that the measurable state of Inspection Apparatus (1) is achieved by deflecting and deforming a complex stack composed of the non-defective circuit board, and the upper-side board-compressing member and lower-side board-compressing member for compressing the non-defective circuit board in the form of a regular wave by shifting in the thickness-wise direction together with the upper-side base plate and lower-side base plate, at positions where it is respectively pressed by the upper-side supports and lower-side supports in accordance with the upper-side supporting points and lower-side supporting points.

[Specification of Non-defective Circuit Board]
Dimensions: 100 mm by 100 mm by 0.8 mm in thickness
Upper-side electrodes to be inspected:
Minimum electrode size: 0.3 mm in diameter,
Arrangement pitch: 0.75 mm,
Number of electrodes: 7,312
Lower-side electrodes to be inspected:
Minimum electrode size: 0.3 mm in diameter,
Arrangement pitch: 0.75 mm,
Number of electrodes: 3,784

[Performance Test]

(1) Measurement of Minimum Pressing Pressure:
The Inspection Apparatus (1) produced was installed in an inspection section of a rail-carried type automatic circuit board inspection machine "STARREC V5", and the non-defective circuit board provided was then set in Inspection Apparatus (1). The pressing pressure of the rail-carried type automatic circuit board inspection machine "STARREC V5" was changed stepwise within a range of 100 to 250 kgf, and a conduction resistance value as to the electrodes to be inspected of the non-defective circuit board when a current of 1 mA was applied to the electrode for current supply in each pair of inspection electrodes was measured by the electrode for voltage measurement for 10 times every pressing pressure conditions.

An inspection point (hereinafter referred to as "NG inspection point") at which the conduction resistance value measured reached 100 Ω or higher was judged to be defective conduction to calculate out a proportion (hereinafter referred to as "proportion of NG inspection points") of the number of the NG inspection points to the total number of inspection points. The lowest pressing pressure under which the proportion of NG inspection points was 0.01% or lower was regarded as a minimum pressing pressure.

In the measurement of this conduction resistance value, the pressing pressure related to this measurement was released after completion of the measurement of a conduction resistance value to return the inspection apparatus to a non-pressurized state, and a pressing pressure of the prescribed intensity was applied again when the next measurement of a conduction resistance value was conducted.

Since the number of the upper-side electrodes to be inspected in the non-defective circuit board is 7,312, the number of the lower-side electrodes to be inspected is 3,784, and the measurement is conducted 10 times every pressing pressure conditions, "the proportion of NG inspection points" specifically indicates a proportion of the NG inspection points to the inspection points of 110,960 calculated out by an equation (7,312+3,784)×10 =110,960 (the same shall apply hereinafter).

In an inspection apparatus, it is necessary that the proportion of NG inspection points is at most 0.01% from the viewpoint of practical use. If the proportion of NG inspection points exceeds 0.01%, an erroneous inspection result that a non-defective circuit board to be inspected is judged to be a defective may be brought about in some cases. There is thus a possibility that the electrical inspection of circuit boards may not be conducted with high reliability.

An inspection apparatus is capable of conducting the electrical inspection of circuit boards to be inspected with lower pressing force, as the minimum pressing pressure becomes lower. If the pressing force upon the inspection can be set low in an inspection apparatus, the deterioration of circuit boards to be inspected, and component members such as anisotropically conductive sheets and circuit boards for inspection by the pressing force upon the inspection can be inhibited, and parts low in durable strength in pressurization may be used as the component members of the inspection apparatus, so that the miniaturization and simplification of the inspection apparatus can be expected. As a result, improvement in the durability of the inspection apparatus itself and reduction in the production cost of the inspection apparatus can be achieved.

(2) Determination of Durability of Anisotropically Conductive Sheet:

The Inspection Apparatus (1) produced was installed in an inspection section of a rail-carried type automatic circuit board inspection machine "STARREC V5", and the non-defective circuit board provided was then set in Inspection Apparatus (1). After pressurization was conducted prescribed times against the non-defective circuit board under conditions of a pressing pressure of 130 kgf by the rail-carried type automatic circuit board inspection machine "STARREC V5", a conduction resistance value as to electrodes to be inspected of the non-defective circuit board when a current of 1 mA was applied to the electrode for current supply in each pair of inspection electrodes was measured 10 times in total by the electrode for voltage measurement under conditions of a pressing pressure of 130 kgf. An inspection point (NG inspection point) at which the conduction resistance value measured reached 100 Ω or higher was judged to be defective conduction to calculate out a proportion (proportion of NG inspection points) of the number of the NG inspection points to the total number of inspection points.

Pressurization was then conducted prescribed times against the non-defective circuit board under the same conditions as described above except that the anisotropically conductive sheets in Inspection Apparatus (1) were replaced by new ones, and the pressing pressure conditions were changed to 150 kgf, and thereafter, a proportion of the NG inspection points was then calculated out in the same manner as described above except that the pressing pressure conditions were changed to 150 kgf to measure a conduction resistance value.

In the measurement of this conduction resistance value related to the durability of the anisotropically conductive sheets, the pressing pressure related to this measurement was released after completion of the measurement of a conduction resistance value to return the inspection apparatus to a non-pressurized state, and a pressing pressure of the prescribed intensity was applied again when the next measurement of a conduction resistance value was conducted.

Comparative Example 1

An inspection apparatus (hereinafter also referred to as "Comparative Inspection Apparatus (1)") for circuit board having the same construction as Inspection Apparatus (1) except that the thickness of the upper-side base plate was set to 10.0 mm, the thickness of the lower-side base plate was set to 13.0 mm, the outer diameter of the tip part of each of the upper-side supports and lower-side supports was set to 6.0 mm, the clearances in the lateral direction between upper-side supports and between lower-side supports were each set to 32.25 mm, the clearances in the vertical direction were each set to 24.75 mm, and the upper-side supporting points and lower-side supporting points were arranged in the following manner was produced.

Since those having a greater thickness compared with Inspection Apparatus (1) were used as the upper-side base plate and lower-side base plate in this Comparative Inspection Apparatus (1), the formation of one through-hole required plural times of drilling operation, the drilling operation time required to form one through-hole became long, and so the productivity was lowered compared with Inspection Apparatus (1).

A minimum pressing pressure and durability of anisotropically conductive sheets were determined in the same manner as in Example 1 except that Comparative Circuit Board (1) produced was used. The measured results of the minimum pressing pressure are shown in Table 1, and the determined results of the durability of anisotropically conductive sheets are shown in Table 2.

Figure 17:
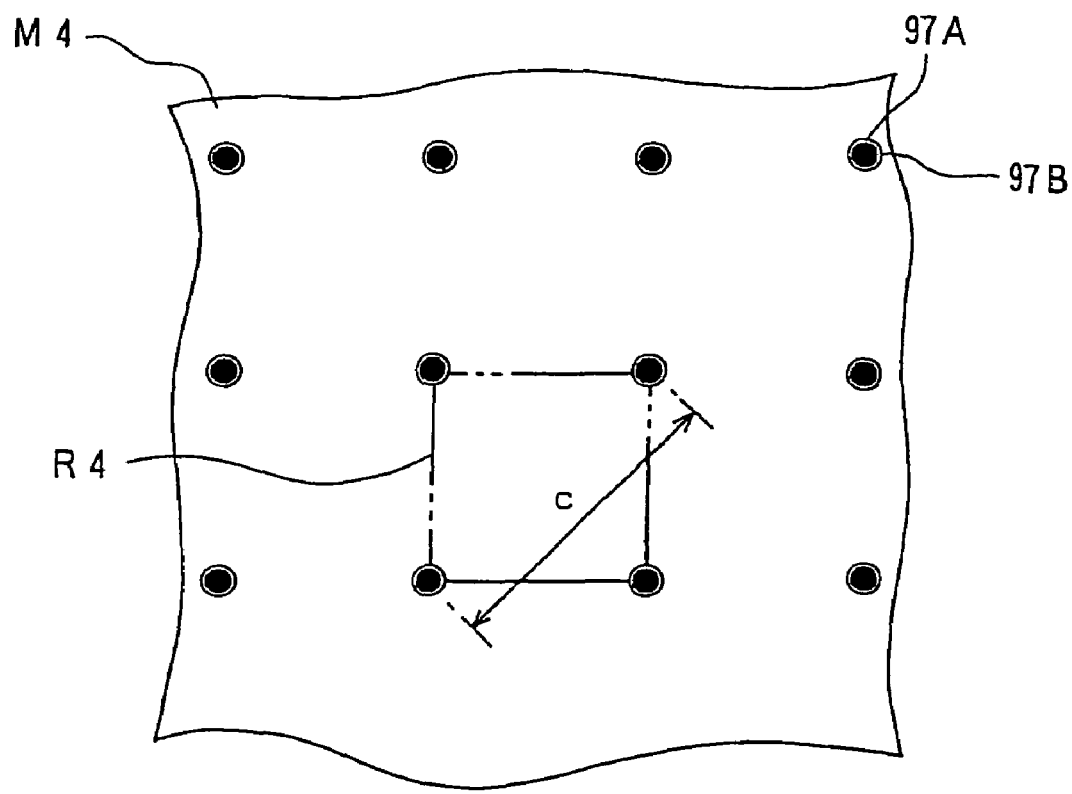
FIG. 17 illustrates a positional relation among supporting points on a plane of projection when the inspection apparatus for circuit board shown in FIG. 16 is seen through from above.
Figure 18:
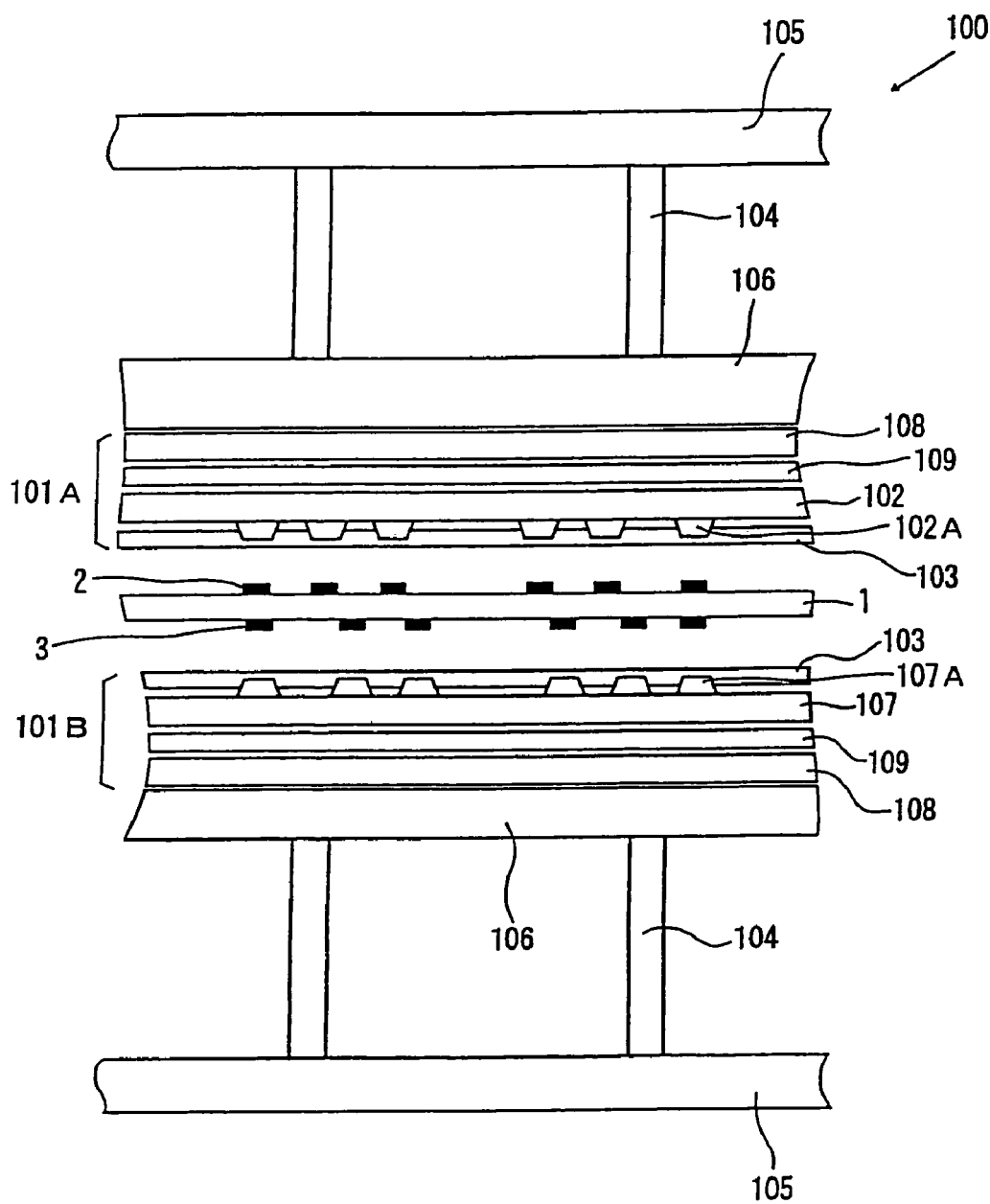
FIG. 18 illustrates the construction of another exemplary conventional inspection apparatus for circuit board together with an inspection object circuit board.

In Comparative Circuit Board (1), the upper-side supporting points and lower-side supporting points are respectively formed in the form of a lattice and are arranged in such a manner that as illustrated in FIG. 17, an upper-side supporting point 97A and a lower-side supporting point 97B are located at the same position on a plane of projection when Comparative Circuit Board (1) is seen through from above. In FIG. 17, one common unit region R4 formed by the upper-side supporting points 97A and the lower-side supporting points 97B is surrounded by an alternate long and two short dashes line.

In Comparative Circuit Board (1), the clearance distances between adjacent upper-side supporting points and between adjacent lower-side supporting points were each 32.25 mm in the lateral direction and 24.75 mm in the vertical direction, and the lengths of a diagonal line of the upper-side unit region (clearance c in FIG. 17) and a diagonal line of the lower-side unit region are each 41 mm. Incidentally, the clearance d shown in FIG. 4 is 0 mm in Comparative Circuit Board (1).

TABLE 1

| Pressing Pressure | Proportion of NG Inspection Points (%) | | | | | | | Minimum Pressing Pressure |
|---|---|---|---|---|---|---|---|---|
| (kgf) | 100 | 110 | 120 | 130 | 150 | 180 | 250 | (kgf) |
| Example | 0.02 | 0 | 0 | 0 | 0 | 0 | 0 | 110 |
| Comparative Example 1 | 1.5 | 0.05 | 0.02 | 0 | 0 | 0 | 0 | 130 |

TABLE 2

| | | Proportion of NG Inspection Points (%) | | | | |
|---|---|---|---|---|---|---|
| Number of Pressing (count) | | 1 | 1000 | 5000 | 10000 | 30000 |
| Example 1 | Pressing 130 kgf Pressure | 0 | 0 | 0 | 0 | 0.01 |
| | Pressing 150 kgf Pressure | 0 | 0 | 0 | 0 | 0 |
| Comparative Example 1 | Pressing 130 kgf Pressure | 0 | 0 | 0.7 | 3.2 | — |
| | Pressing 150 kgf Pressure | 0 | 0 | 0.15 | 2.5 | — |

Example 2

An inspection apparatus (hereinafter also referred to as "Inspection Apparatus (2)") for circuit board of the following conditions, which is adapted to an inspection section of a rail-carried type automatic circuit board inspection machine "STARREC V5" (manufactured by NIDEC-READ CORPORATION) was produced in accordance with the construction shown in FIG. 13.

Upon the production of this Inspection Apparatus (2), that having a thickness of 4.0 mm was used as an upper-side base plate, so that one through-hole was capable of being formed by one drilling operation, the drilling operation time required to form one through-hole was able to be shortened compared with a lower-side base plate that has a thickness of 6.0 mm and requires plural times of drilling operation for forming one through-hole, and the through-holes were capable of being formed with high efficiency.

In Inspection Apparatus (2), upper-side supporting points and lower-side supporting points are respectively formed in the form of a lattice and arranged in such a manner that on the specific plane of projection, one lower-side supporting point is arranged at a position where 2 diagonal lines intersect with each other within a rectangular upper-side unit region partitioned by adjacent 4 upper-side supporting points, and one upper-side supporting point is arranged at a position where 2 diagonal lines intersect with each other within a rectangular lower-side unit region partitioned by adjacent 4 lower-side supporting points.

(1) Upper-side Adaptor:

[Circuit Board for Inspection]
   Total number of inspection electrodes: 7,312
   Dimensions of minimum inspection electrodes:
   60 μm by 150 μm
   Total number of terminal electrodes: 3,784
   Dimensions of minimum terminal electrodes:
   60 μm by 150 μm
   Material of base material:
   glass fiber-reinforced epoxy resin
   Maximum thickness: 1.0 mm

[Anisotropically Conductive Sheet]
   Dimensions: 110 mm by 110 mm by 0.1 mm in thickness
   Conductive particles:
   material: nickel particles plated with gold,
   average particle diameter: 20 μm,
   content: 18% by volume
   Elastic polymeric substance:
   material: silicone rubber,
   hardness: 40

(2) Upper-side Inspection Head:

[Inspection pin]
   Material: brass plated with gold
   Dimensions of tip part:
   0.35 mm in outer diameter, 0.1 mm in overall length
   Dimensions of central part:
   0.48 mm in outer diameter, 1.8 mm in overall length
   Dimensions of large-diameter part:
   0.55 mm in outer diameter, 0.1 mm in overall length
   Dimensions of proximal part:
   0.48 mm in outer diameter, 3.0 mm in overall length
   Clearance between adjacent inspection pins: 0.75 mm

[Anisotropically Conductive Sheet]
   Dimensions: 110 mm by 110 mm by 0.25 mm in thickness
   Conductive particles:
   material: nickel particles plated with gold,
   average particle diameter: 35 μm,
   content: 13% by volume
   Elastic polymeric substance:
   material: silicone rubber,
   hardness: 30

[Spacer Board]
   Material: glass fiber-reinforced epoxy resin material "FR-4"
   Dimensions: 200 mm by 346 mm by 1.9 mm in thickness (3) Upper-side Base Plate:
   Material: glass fiber-reinforced epoxy resin material "FR-4"
   Dimensions: 200 mm by 346 mm by 4.0 mm in thickness
   Mass: 0.5 kg (4) Upper-side Support:
   Material: brass
   Dimensions:
   outer diameter of tip part: 4 mm,
   overall length: 67 mm
   Clearance between adjacent upper-side supports:
   lateral direction: 32.25 mm
   vertical direction: 24.75 mm (5) Lower-side Adaptor

[Circuit Board for Inspection]
   Total number of inspection electrodes: 7,312
   Dimensions of minimum inspection electrodes:
   60 μm by 150 μm
   Total number of terminal electrodes: 3,784
   Dimensions of minimum terminal electrodes:
   60 μm by 150 μm
   Material of base material:
   glass fiber-reinforced epoxy resin
   Maximum thickness: 1.0 mm

[Anisotropically Conductive Sheet]
  Dimensions: 100 mm by 110 mm by 0.1 mm in thickness
  Conductive particles:
    material: nickel particles plated with gold,
    average particle diameter: 20 μm,
    content: 18% by volume
  Elastic polymeric substance:
    material: silicone rubber,
    hardness: 40

(6) Lower-side Inspection Head:

[Inspection Pin]
  Material: brass plated with gold
  Dimensions of tip part:
    0.35 mm in outer diameter, 0.1 mm in overall length
  Dimensions of large-diameter part:
    0.55 mm in outer diameter, 1.8 mm in overall length
  Dimensions of proximal part:
    0.48 mm in outer diameter, 3.0 mm in overall length
  Clearance between adjacent inspection pins: 0.75 mm

[Anisotropically Conductive Sheet]
  Dimensions: 100 mm by 110 mm by 0.25 in thickness
  Conductive particles:
    material: nickel particles plated with gold,
    average particle diameter: 35 μm,
    content: 13% by volume
  Elastic polymeric substance:
    material: silicone rubber,
    hardness: 30

[Spacer Board]
  Material: glass fiber-reinforced epoxy resin material "FR-4"
  Dimensions: 100 mm by 338 mm by 1.9 mm in thickness

[Alignment Movable Plate]
  Dimensions: 100 mm by 338 mm by 2.95 mm in thickness (7) Lower-side Base Plate:
  Material: glass fiber-reinforced epoxy resin material "FR-4"
  Dimensions: 100 mm by 338 mm by 6.0 mm in thickness
  Projected height of projected part: 3.0 mm
  Mass: 0.4 kg (8) Lower-side Support:
  Material: brass
  Dimensions:
    outer diameter of tip part: 4 mm,
    overall length: 65 mm
  Clearance between adjacent lower-side supports:
    Tateral direction: 32.25 mm,
    Vertical direction: 24.75 mm (9) Upper-side Supporting Points and Lower-side Supporting Points:
  Clearance between adjacent upper-side supporting points:
    Lateral direction: 32.25 mm,
    Vertical direction: 24.75 mm
  Length of diagonal line in upper-side unit region:
    about 41 mm
  Clearance between adjacent lower-side supporting points:
    Lateral direction: 32.25 mm,
    Vertical direction: 24.75 mm
  Length of diagonal line in lower-side unit region: about 41 mm
  Clearance between lower-side supporting point and upper-side supporting point located within upper-side unit region: about 20 mm In Inspection Apparatus (2), the non-defective circuit board used in Example 1 was used as a circuit board to be inspected to conduct a performance test in the same manner as in the measurement of the minimum pressing pressure in Example 1 except that the conduction resistance value when a current of 1 mA was applied to an inspection electrode in the measurement of the minimum pressing pressure in Example 1 was measured in the inspection electrode, and to conduct another performance test in the same manner as in the determination of the durability of the anisotropically conductive sheets in Example 1 except that the conduction resistance value when a current of 1 mA was applied to an inspection electrode in the determination of the durability of the anisotropically conductive sheets in Example 1 was measured in the inspection electrode, the pressing pressure conditions of 130 kgf was changed to 150 kgf, and the pressing pressure conditions of 150 kgf was changed to 180 kgf. The measured results of the minimum pressing pressure are shown in Table 3, and the determined results of the durability of anisotropically conductive sheets are shown in Table 4.

In the performance tests, it was confirmed that the measurable state of Inspection Apparatus (2) is achieved by deflecting and deforming a complex stack composed of the non-defective circuit board, and the upper-side board-compressing member and lower-side board-compressing member for compressing the non-defective circuit board in the form of a regular wave by shifting in the thickness-wise direction together with the upper-side base plate and lower-side base plate, at positions where it is respectively pressed by the upper-side supports and lower-side supports in accordance with the upper-side supporting points and lower-side supporting points.

Comparative Example 2

An inspection apparatus (hereinafter also referred to as "Comparative Inspection Apparatus (2)") for circuit board having the same construction as Inspection Apparatus (2) except that the thickness of the upper-side base plate was set to 10.0 mm, the thickness of the lower-side base plate was set to 13.0 mm, the outer diameter of the tip part of each of the upper-side supports and lower-side supports was set to 6.0 mm, the clearances in the lateral direction between upper-side supports and between lower-side supports were each set to 32.25 mm, and the clearances in the vertical direction were each set to 24.75 mm was produced.

Since those having a greater thickness compared with Inspection Apparatus (2) were used as the upper-side base plate and lower-side base plate in this Comparative Inspection Apparatus (2), the formation of one through-hole required plural times of drilling operation, the drilling operation time required to form one through-hole became long, and so the productivity was lowered compared with Inspection Apparatus (2).

A minimum pressing pressure and durability of anisotropically conductive sheets were determined in the same manner as in Example 2 except that Comparative Circuit Board (2) produced was used. The measured results of the minimum pressing pressure are shown in Table 3, and the determined results of the durability of anisotropically conductive sheets are shown in Table 4.

In Comparative Circuit Board (2), the upper-side supporting points and lower-side supporting points are respectively formed in the form of a lattice under the same conditions as the upper-side supporting points and lower-side supporting points in Comparative Circuit Board (1).

TABLE 3

| Pressing Pressure | Proportion of NG Inspection Points (%) | | | | | | Minimum Pressing Pressure |
|---|---|---|---|---|---|---|---|
| (kgf) | 100 | 110 | 130 | 150 | 180 | 250 | (kgf) |
| Example 2 | 0.01 | 0 | 0 | 0 | 0 | 0 | 110 |
| Comparative Example 2 | 2.3 | 0.2 | 0.03 | 0 | 0 | 0 | 150 |

TABLE 4

| | | Proportion of NG Inspection Points (%) | | | | |
|---|---|---|---|---|---|---|
| Number of Pressing (Count) | | 1 | 1000 | 5000 | 10000 | 30000 |
| Example 2 | Pressing 150 kgf Pressure | 0 | 0 | 0 | 0 | 0 |
| | Pressing 180 kgf Pressure | 0 | 0 | 0 | 0 | 0.02 |
| Comparative Example 2 | Pressing 150 kgf Pressure | 0 | 0 | 0.9 | 2.3 | — |
| | Pressing 180 kgf Pressure | 0 | 0 | 0.2 | 3.1 | — |

The invention claimed is:

1. An inspection apparatus for circuit board for conducting electrical inspection of an inspection object circuit board by electrically connecting inspection object electrodes of the inspection object circuit board to a plurality of inspection electrodes formed in accordance with a pattern corresponding to the inspection object electrodes through an anisotropically conductive sheet, which comprises:
   an upper-side board-compressing member arranged on an upper side of the inspection object circuit board and a lower-side board-compressing member arranged on a lower side of the inspection object circuit board,
   wherein either one of the upper-side board-compressing member and lower-side board-compressing member has the plurality of the inspection electrodes, the upper-side board-compressing member and lower-side board-compressing member are respectively provided on base plates supported by a plurality of supports infixed into support-infixing plates, and an upper-side supporting point corresponds to the upper-side support on the upper-side base plate related to the upper-side board-compressing member and a lower-side supporting point corresponds to the lower-side support on the lower-side base plate related to the lower-side board-compressing member are arranged at positions different from each other on a plane of projection in a thickness-wise direction of the upper-side board-compressing member and lower-side board-compressing member when the inspection apparatus is seen through from above, and
   in the measurable state, a complex stack composed of the inspection object circuit board, and the upper-side board-compressing member and lower-side board-compressing member for compressing the inspection object circuit board is deformed by shifting in the thickness-wise direction together with the upper-side base plate and lower-side base plate, at positions, over the whole body, respectively pressed by the upper-side supports and lower-side supports in accordance with the upper-side supporting points and lower-side supporting points.

2. The inspection apparatus for circuit board according to claim 1, wherein the upper-side board-compressing member has an anisotropically conductive sheet on its surface, and the lower-side board-compressing member has an anisotropically conductive sheet on its surface.

3. The inspection apparatus for circuit board according to claim 1, wherein the upper-side base plate and the lower-side base plate are pressed, respectively, by the upper-side supports and the lower-side supports, thereby bringing about a measurable state that the inspection object circuit board is compressed by the upper-side board-compressing member and lower-side board-compressing member.

4. The inspection apparatus for circuit board according to claim 1, wherein, in the measurable state, a gap in the thickness-wise direction of the complex stack between a tip level in the upper-side support and a tip level in the lower-side support is smaller than the total thickness of the complex stack, the upper-side base plate and the lower-side base plate.

5. The inspection apparatus for circuit board according to claim 1, wherein the upper-side supporting points and the lower-side supporting points are formed in the form of a lattice on the upper-side base plate and on the lower-side base plate, respectively, and on the plane of projection in the thickness-wise direction of the upper-side board-compressing member and the lower-side board-compressing member, only one lower-side supporting point is arranged within an upper-side unit region partitioned by adjacent 4 upper-side supporting points, and only one upper-side supporting point is arranged within a lower-side unit region partitioned by adjacent 4 lower-side supporting points.

6. The inspection apparatus for circuit board according to claim 5, wherein clearances between upper-side supporting points adjacent to each other related to the upper-side unit region, and between lower-side supporting points adjacent to each other related to the lower-side unit region are each 10 to 100 mm.

7. The inspection apparatus for circuit board according to claim 1, wherein the upper-side base plate and lower-side base plate are each composed of an insulating material having a resistivity of at least $1 \times 10^{10}$ Ω·cm, and have a thickness of 1 to 10 mm.

8. The inspection apparatus for circuit board according to claim 1, wherein the thickness of each of the upper-side base plate and lower side base plate is at most 5 mm.

9. An inspection process for circuit board, which comprises:
   using the inspection apparatus for circuit board according to claim 1,
   pressing the upper-side base plate and the lower-side base plate by the upper-side supports and the lower-side supports, respectively, to form a measurable state that an inspection object circuit board is compressed by the upper-side board-compressing member and lower-side board-compressing member, and
   in this measurable state, deforming a complex stack composed of the inspection object circuit board and the upper-side board-compressing member and lower-side board compressing member for compressing the inspection object circuit board by shifting in the thickness-wise direction together with the upper-side base plate and lower-side base plate, at positions, over the whole body, respectively pressed by the upper-side supports and lower-side supports in accordance with the upper-side supporting points and lower-side supporting points.

* * * * *